US010190018B2

(12) United States Patent
Jain et al.

(10) Patent No.: US 10,190,018 B2
(45) Date of Patent: Jan. 29, 2019

(54) DI- AND MONO(METH)ACRYLATE BASED ORGANIC THIN FILM INK COMPOSITIONS

(71) Applicant: Kateeva, Inc., Newark, CA (US)

(72) Inventors: Rajsapan Jain, Sunnyvale, CA (US); Citra Yuwono, Fremont, CA (US); Michelle Chan, San Francisco, CA (US); Inna Tregub, Menlo Park, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 15/214,115

(22) Filed: Jul. 19, 2016

(65) Prior Publication Data

US 2017/0062762 A1    Mar. 2, 2017

Related U.S. Application Data

(60) Provisional application No. 62/212,338, filed on Aug. 31, 2015.

(51) Int. Cl.

| | | |
|---|---|---|
| *C08F 2/46* | (2006.01) | |
| *C08F 2/50* | (2006.01) | |
| *C08G 61/04* | (2006.01) | |
| *C09D 135/02* | (2006.01) | |
| *C09D 133/06* | (2006.01) | |
| *C09D 133/10* | (2006.01) | |
| *H01L 51/00* | (2006.01) | |
| *C09D 11/101* | (2014.01) | |
| *H01L 51/56* | (2006.01) | |
| *H01L 51/52* | (2006.01) | |

(52) U.S. Cl.
CPC .......... *C09D 135/02* (2013.01); *C09D 11/101* (2013.01); *C09D 133/06* (2013.01); *C09D 133/10* (2013.01); *H01L 51/0004* (2013.01); *H01L 51/0007* (2013.01); *H01L 51/0034* (2013.01); *H01L 51/0043* (2013.01); *H01L 51/5256* (2013.01); *H01L 51/56* (2013.01)

(58) Field of Classification Search
USPC ....... 428/26, 22; 522/64, 6, 71, 189, 184, 1; 520/1
See application file for complete search history.

(56) References Cited

U.S. PATENT DOCUMENTS

| | | | |
|---|---|---|---|
| 5,681,666 A | 10/1997 | Treger et al. | |
| 5,690,722 A | 11/1997 | Pawlowski | |
| 5,952,778 A | 9/1999 | Haskal et al. | |
| 6,146,225 A | 11/2000 | Sheats et al. | |
| 6,198,217 B1 | 3/2001 | Suzuki et al. | |
| 6,268,695 B1 | 7/2001 | Affinito | |
| 6,492,026 B1 | 12/2002 | Graff et al. | |
| 6,522,067 B1 | 2/2003 | Graff et al. | |
| 6,550,906 B2 | 4/2003 | Ylitalo | |
| 6,570,325 B2 | 5/2003 | Graff et al. | |
| 6,597,111 B2 | 7/2003 | Silvernail et al. | |
| 6,664,137 B2 | 12/2003 | Weaver | |
| 6,720,203 B2 | 4/2004 | Carcia et al. | |
| 6,866,901 B2 | 3/2005 | Burrows et al. | |
| 6,872,473 B2 | 3/2005 | Song et al. | |
| 6,945,647 B2 | 9/2005 | Yip et al. | |
| 6,949,389 B2 | 9/2005 | Pichler et al. | |
| 6,962,671 B2 | 11/2005 | Martin et al. | |
| 7,005,199 B2 | 2/2006 | Kim et al. | |
| 7,074,501 B2 | 7/2006 | Czeremuszkin et al. | |
| 7,187,119 B2 | 3/2007 | Weaver | |
| 7,198,832 B2 | 4/2007 | Burrows et al. | |
| 7,307,119 B2 | 12/2007 | Kim et al. | |
| 7,317,280 B2 | 1/2008 | Qiu et al. | |
| RE40,531 E | 10/2008 | Graff et al. | |
| 7,486,019 B2 | 2/2009 | Padiyath et al. | |
| 7,510,913 B2 | 3/2009 | Moro et al. | |
| 7,621,794 B2 | 11/2009 | Lee et al. | |
| 7,683,534 B2 | 3/2010 | Weaver | |
| 7,709,097 B2 | 5/2010 | Agata et al. | |
| 7,727,601 B2 | 6/2010 | Burrows et al. | |
| 7,745,506 B2 | 6/2010 | Satou et al. | |
| 7,767,498 B2 | 8/2010 | Moro et al. | |
| 7,868,109 B2 | 1/2011 | Samukawa et al. | |
| 7,955,700 B2 | 6/2011 | Agata | |
| 8,101,288 B2 | 1/2012 | Aiba | |
| 8,329,306 B2 | 12/2012 | Oouchi et al. | |
| 8,637,147 B2 | 1/2014 | Tsukahara et al. | |
| 8,638,032 B2 | 1/2014 | Maindron et al. | |
| 2003/0127973 A1 | 7/2003 | Weaver et al. | |

(Continued)

FOREIGN PATENT DOCUMENTS

| | | |
|---|---|---|
| CN | 1737067 A | 2/2006 |
| DE | 19603746 A1 | 4/1997 |

(Continued)

OTHER PUBLICATIONS

Non-Final Office Action dated Apr. 26, 2017, to U.S. Appl. No. 14/806,276.
Non-Final Office action dated Mar. 9, 2017, to U.S. Appl. No. 15/178,856.
Affinito, J. "Polymer Film Deposition by a New Vacuum Process," 45th Annual Technical Conference Proceedings, 2002.
International Search Report and Written Opinion dated Oct. 16, 2015, to PCT Application PCT/US2015/041578.
International Search Report and Written Opinion dated Sep. 23, 2016, to PCT Application PCT/US2016/042918.
International Search Report and Written Opinion dated Sep. 8, 2016, to PCT Application PCT/US16/36853.

(Continued)

*Primary Examiner* — Jessica Whiteley
(74) *Attorney, Agent, or Firm* — Paula J. Tostado

(57) ABSTRACT

The present teachings relate to various embodiments of an ink composition, which once printed and cured forms an organic thin film on a substrate such as, but not limited by, an OLED device substrate. Various embodiments of the ink compositions comprise polyethylene glycol di(meth)acrylate monomers, mono(meth)acrylate monomers and multifunctional crosslinking agents.

20 Claims, 31 Drawing Sheets

(56) References Cited

U.S. PATENT DOCUMENTS

| | | |
|---|---|---|
| 2003/0164674 A1 | 9/2003 | Imamura |
| 2003/0203210 A1 | 10/2003 | Graff et al. |
| 2004/0163570 A1 | 8/2004 | Vanmaele et al. |
| 2005/0104945 A1* | 5/2005 | Chung .............. C03C 17/002 347/101 |
| 2005/0137282 A1 | 6/2005 | Cagle et al. |
| 2005/0159501 A1 | 7/2005 | Kiefer-Liptak |
| 2005/0176181 A1 | 8/2005 | Burrows et al. |
| 2005/0197419 A1* | 9/2005 | Graziano .............. C09D 11/101 522/74 |
| 2005/0238846 A1 | 10/2005 | Arakatsu et al. |
| 2005/0249895 A1 | 11/2005 | Sisler et al. |
| 2006/0223903 A1 | 10/2006 | Cao et al. |
| 2006/0223937 A1 | 10/2006 | Herr et al. |
| 2007/0112094 A1 | 5/2007 | Noutary |
| 2008/0045618 A1 | 2/2008 | Nagvekar |
| 2008/0103280 A1 | 5/2008 | Satou et al. |
| 2009/0191342 A1 | 7/2009 | Chu et al. |
| 2009/0297771 A1 | 12/2009 | Ito et al. |
| 2009/0324970 A1 | 12/2009 | Ito |
| 2010/0156277 A1 | 6/2010 | Visser et al. |
| 2010/0159792 A1 | 6/2010 | Visser et al. |
| 2010/0193468 A1 | 8/2010 | Burrows et al. |
| 2010/0196679 A1 | 8/2010 | Morishima |
| 2011/0070372 A1 | 3/2011 | Faucher et al. |
| 2011/0272682 A1 | 11/2011 | Blizzard et al. |
| 2011/0298361 A1 | 12/2011 | Matsunaga et al. |
| 2012/0090661 A1 | 4/2012 | Capps et al. |
| 2012/0208033 A1 | 8/2012 | Weigel et al. |
| 2013/0026415 A1 | 1/2013 | James et al. |
| 2013/0187968 A1 | 7/2013 | Cofler |
| 2013/0252533 A1* | 9/2013 | Mauck .............. B41J 29/393 454/187 |
| 2013/0309397 A1* | 11/2013 | Breton .............. B41M 1/08 427/145 |
| 2014/0029299 A1 | 1/2014 | Hyun et al. |
| 2014/0106492 A1 | 4/2014 | Chung et al. |
| 2014/0178675 A1 | 6/2014 | Ha et al. |
| 2014/0212634 A1 | 7/2014 | Kameyama et al. |
| 2014/0235742 A1 | 8/2014 | Cho et al. |
| 2014/0319497 A1 | 10/2014 | Cho et al. |
| 2015/0042731 A1* | 2/2015 | Hiraoka .............. C09D 11/101 347/86 |
| 2015/0165755 A1 | 6/2015 | Jin et al. |
| 2015/0179976 A1 | 6/2015 | Galand et al. |
| 2015/0364690 A1 | 12/2015 | Nam et al. |
| 2016/0024322 A1 | 1/2016 | Jain et al. |
| 2016/0329524 A1 | 11/2016 | Cha et al. |

FOREIGN PATENT DOCUMENTS

| | | | |
|---|---|---|---|
| EP | 2161315 A1 | 3/2010 | |
| JP | H07169567 A | 7/1995 | |
| TW | 201404835 B | 10/2017 | |
| WO | 2004026978 A1 | 4/2004 | |
| WO | 2014012931 A1 | 1/2014 | |
| WO | 2014021941 A1 | 2/2014 | |
| WO | 2014025983 A1 | 2/2014 | |
| WO | WO-2014021941 A1 * | 2/2014 | ............ H05K 3/182 |
| WO | 2015046741 A1 | 4/2015 | |

OTHER PUBLICATIONS

Leterrier, Yves, "Durability of Nanosized Oxygen-Barrier Coatings on Polymers," Progress in Materials Science, vol. 48, 2003, pp. 1-55.

Lewis et al., "Thin-Film Permeation-Barrier Technology for Flexible Organic Light-Emitting Devices," IEEE Journal of Selected Topics in Quantum Electronics, vol. 10, No. 1, Jan.-Feb. 2004.

Applicant Interview Summary dated Jun. 14, 2017, to U.S. Appl. No. 15/178,856.

Non-Final Office action dated Sep. 21, 2017, to U.S. Appl. No. 15/178,856.

Notice of Allowance dated Aug. 16, 2017, to U.S. Appl. No. 14/806,276.

Notice of Allowance dated Jan. 9, 2018, to U.S. Appl. No. 14/806,276.

Extended European Search Report dated Mar. 15, 2018 for EP Patent Application No. 15824051.5.

Non-Final Office Action dated Mar. 20, 2018 for U.S. Appl. No. 15/814,316.

Supplemental Notice of Allowance dated Feb. 1, 2018 for U.S. Appl. No. 14/806,276.

Final Office Action dated May 11, 2018, for U.S. Appl. No. 15/178,856.

Examination Report dated Sep. 20, 2018, to TW Patent Application No. 104124028.

International Search Report and Written Opinion dated Aug. 27, 2018, to PCT Application No. PCT/US18/27954.

* cited by examiner

US 10,190,018 B2

DI- AND MONO(METH)ACRYLATE BASED ORGANIC THIN FILM INK COMPOSITIONS

RELATED APPLICATIONS

The present application claims priority to U.S. provisional patent application No. 62/212,338 that was filed on Aug. 31, 2015, the entire contents of which are incorporated herein by reference.

FIELD

The present teachings relate to various embodiments of an ink composition, and a polymeric thin film formed on a substrate, such as, but not limited by, an OLED device substrate. Various embodiments of the ink can be printed using an industrial inkjet printing system that can be housed in a gas enclosure, which gas enclosure defines an interior that has a controlled environment maintained as an inert and substantially low-particle process environment.

OVERVIEW

Interest in the potential of organic light-emitting diode (OLED) display technology has been driven by OLED display technology attributes that include demonstration of display panels that have highly saturated colors, are high-contrast, ultrathin, fast-responding, and energy efficient. Additionally, a variety of substrate materials, including flexible polymeric materials, can be used in the fabrication of OLED display technology. Though the demonstration of displays for small screen applications, primarily for cell phones, has served to emphasize the potential of the technology, challenges remain in scaling high volume manufacturing across a range of substrate formats in high yield.

With respect to scaling of formats, a Gen 5.5 substrate has dimensions of about 130 cm×150 cm and can yield about eight 26" flat panel displays. In comparison, larger format substrates can include using Gen 7.5 and Gen 8.5 mother glass substrate sizes. A Gen 7.5 mother glass has dimensions of about 195 cm×225 cm, and can be cut into eight 42" or six 47" flat panel displays per substrate. The mother glass used in Gen 8.5 is approximately 220 cm×250 cm, and can be cut to six 55" or eight 46" flat panel displays per substrate. One indication of the challenges that remain in scaling of OLED display manufacturing to larger formats is that the high-volume manufacture of OLED displays in high yield on substrates larger than Gen 5.5 substrates has proven to be substantially challenging.

In principle, an OLED device may be manufactured by the printing of various organic thin films, as well as other materials, on a substrate using an OLED printing system. Such organic materials can be susceptible to damage by oxidation and other chemical processes. As such, printing of various organic stack layers in an inert environment is indicated. Additionally, the need for a substantially particle-free environment is indicated in order to realize a high-yield manufacturing process. In addition to the printing of various layers of an OLED stack into a plurality of discrete pixel locations, patterned area printing using an industrial inkjet system can be done. For example, during fabrication of an OLED device, inkjet printing of various encapsulation layers can be done. Given the sensitivity of the various organic materials of an OLED stack that can be damaged by oxidation and other chemical processes, as well as defects due to particulate matter in a printed thin layer of a material, the patterned printing of an encapsulation layer in an inert, substantially particle free environment is also indicated.

However, housing an OLED printing system in a fashion that can be scaled for various substrate sizes and can be done in an inert, substantially low-particle printing environment can present a variety of engineering challenges. Manufacturing tools for high throughput large-format substrate printing, for example, such as printing of Gen 7.5 and Gen 8.5 substrates, require substantially large facilities. Accordingly, maintaining a large facility under an inert atmosphere, requiring gas purification to remove reactive atmospheric species, such as water vapor and oxygen, as well as organic solvent vapors, as well as maintaining a substantially low-particle printing environment, has proven to be significantly challenging.

As such, challenges remain in scaling high volume manufacturing of OLED display technology across a range of substrate formats in high yield. Accordingly, there exists a need for various embodiments a gas enclosure system of the present teachings that can house an OLED printing system, in an inert, substantially low-particle environment, and can be readily scaled to provide for fabrication of OLED panels on a variety of substrates sizes and substrate materials. Additionally, various gas enclosure systems of the present teachings can provide for ready access to an OLED printing system from the exterior during processing and ready access to the interior for maintenance with minimal downtime.

BRIEF DESCRIPTION OF THE DRAWINGS

A better understanding of the features and advantages of the present disclosure will be obtained by reference to the accompanying drawings, which are intended to illustrate, not limit, the present teachings.

FIG. 2A displays a film of 8 µm thickness, which was printed without incorporating edge compensation. FIG. 2B is a film of 16 µm thickness, which was printed using edge compensation.

DETAILED DESCRIPTION OF THE DISCLOSURE

Figure 1:
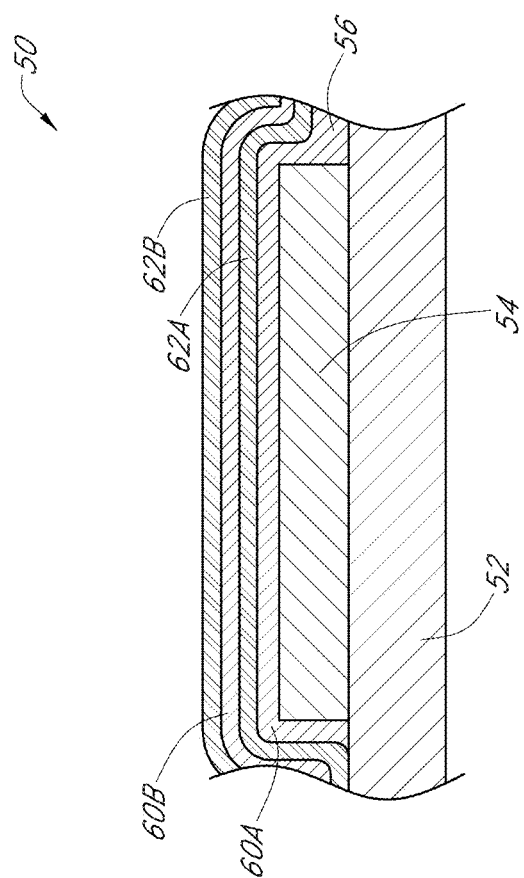
FIG. 1 is a schematic section view of an optoelectronic device, illustrating various aspects of a fabrication.

The present teachings relate to various embodiments of a ink composition, which once printed and cured forms a polymeric thin film on a substrate, such as, but not limited by, an OLED device substrate. Various embodiments of the ink can be printed using an industrial inkjet printing system that can be housed in a gas enclosure, which gas enclosure defines an interior that has a controlled environment maintained as an inert and substantially low-particle process environment. Patterned printing of an organic thin film on a substrate, for example, but not limited by, an OLED device substrate, in such a controlled environment can ensure a high-volume, high yield process for a variety of OLED devices.

It is contemplated that a wide variety of ink formulations can be printed within the inert, substantially low-particle environment of various embodiments of a gas enclosure system of the present teachings. During the manufacture of an OLED display, an OLED pixel can be formed to include an OLED film stack, which can emit light of a specific peak wavelength when a voltage is applied. An OLED film stack structure between an anode and a cathode can include a hole injection layer (HIL), a hole transport layer (HTL), an emissive layer (EL), an electron transport layer (ETL) and an electron injection layer (EIL). In some embodiments of an OLED film stack structure, an electron transport layer (ETL) can be combined with an electron injection layer (EIL) to form an ETL/EIL layer. According to the present teachings, various ink formulations for an EL for various color pixel EL films of an OLED film stack can be printed using inkjet printing. Additionally, for example, but not limited by, the HIL, HTL, EML, and ETL/EIL layers can have ink formulations that can be printed using inkjet printing.

As will be discussed in more detail subsequently herein, it is further contemplated that an organic encapsulation layer can be printed on an OLED panel using inkjet printing. An encapsulation ink can comprise a polymer or polymer component, for example, but not limited by, various polyethylene glycol monomer materials, an acrylate, such as a mono- or multidentate acrylate, a methacrylate, such as a mono- or multidentate methacrylate, or other material, as well as copolymers and mixtures thereof, which can be cured using thermal processing (e.g. bake), UV exposure, and combinations thereof. As used herein polymer and copolymer can include any form of a polymer component that can be formulated into an ink and cured on a substrate to form an organic encapsulation layer. Such polymeric components can include polymers and copolymers, as well as precursors thereof, for example, but not limited by, monomers, oligomers, and resins. According to the present teachings, inkjet printing can provide several advantages. First, a range of vacuum processing operations can be eliminated because such inkjet-based fabrication can be performed at atmospheric pressure. Additionally, during an inkjet printing process, an organic encapsulation layer can be localized to cover portions of an OLED substrate over and proximal to an active region, to effectively encapsulate an active region, including lateral edges of the active region. The targeted patterning using inkjet printing results in eliminating material waste, as well as eliminating additional processing typically required to achieve patterning of an organic layer.

Organic Thin Film Ink Compositions and Methods

Various embodiments of an organic thin layer ink composition of the present teachings can be printed, for example, but not limited by, on an optoelectronic device, such as a wide number of OLED devices, to form an organic encapsulation layer. According to various embodiments of compositions and methods, once cured, the resulting polymeric thin film can provide a fluid barrier, as well as providing planarization of a previously fabricated inorganic encapsulation layer, and additionally exhibiting the flexibility desired from an organic encapsulation layer. The fluid barriers can prevent or reduce the permeation of, for example, water and/or oxygen into the OLED devices.

As depicted in the schematic section view of FIG. 1, for optoelectronic device 50, a substrate 52 can be provided. Various embodiments of a substrate can include one or more of a thin silica-based glass, as well as any of a number of flexible polymeric materials. For example, substrate 52 can be transparent, such as for use in a bottom-emitting optoelectronic device configuration. One or more layers associated with an OLED stack, such as various organic or other material can be deposited, inkjet printed, or otherwise formed upon the substrate to provide an active region 54, such as to provide electroluminescent region. Note that active region 54 in FIG. 1 is illustrated schematically as a single block, but can in detail further include a region having complex topology or structure with multiple discrete devices and film layers. In an example, 50 can include an OLED device, such as comprising an emissive layer, or other layers, coupled to an anode electrode and a cathode electrode. The phrase "active" need not imply any requirement of amplification of electrical energy or transistor activity, and can refer generally to a region wherein optoelectrical activity (e.g., light emission) can occur. Accordingly, active region 54 can be included as a portion of an active matrix OLED or a passive matrix OLED device.

Respective layers included in an OLED device, such as in the active region 54, can be on the order of tens or hundreds of nanometers (nm) thick, or less. Additional organic layers that are not active in the optoelectronic action of the OLED device can be included, and such layers can be on the order of microns thick, or less. An anode electrode or a cathode electrode can be coupled to or can include electrode portion 56 that is laterally offset along the substrate 52 from the active region 54. As will be discussed in more detail herein, the active region 54 of the device 50 can include materials that degrade in the presence of prolonged exposure to various reactive species gaseous species, such as, but not limited by, water, oxygen, as well as various solvent vapors from device processing. Such degradation can impact stability and reliability.

As depicted in FIG. 1, an inorganic layer 60A can be provided for device 50, such as deposited or otherwise formed on active region 54. For example, the inorganic layer can be blanket coated (e.g., deposited) over an entirety, or substantially an entirety of a surface of the substrate 52, including active region 54. Examples of inorganic materials useful for fabricating inorganic layer 60A can include various oxides, such as one or more of $Al_2O_3$, $TiO_2$, $HfO_2$, $SiO_xN_y$, or one or more other materials. Organic layer 62A can be printed, using for example, inkjet printing. For example, as previous generally discussed herein organic layer 62A can be printed using an organic thin layer ink that can include various polymer materials that are curable using one or more of a thermal (e.g., bake) or ultraviolet exposure technique, and once cured can form polymeric thin film, such as organic layer 62A. Organic layer 62A can serve as one or more of a planarization layer to planarize and mechanically protect the active region 54, or as a portion of an encapsulation stack that collectively serves to suppress or inhibit moisture or gas permeation into the active region 54. FIG. 1 illustrates generally a multi-layer configuration of encapsulation material layers having inorganic layer 60A such as including an oxide, and the organic layer 62A, such as including a polymer that can be used to inhibit or suppress exposure of the active region 54 to reactive gases, such as, but not limited by, moisture or atmospheric gases. As depicted in FIG. 1, the multi-layer configuration can be repeated to include second inorganic layer 60B and second organic layer 62B. Various additional embodiments of encapsulation layers can be created to provide the mechanical and sealing properties desired for an optoelectronic device. For example, the order of the fabrication of the layers could be reversed, so that an organic encapsulation layer is first fabricated, followed by the fabrication of an inorganic layer. Additionally, more or less numbers of layers can be provided. For example, a structure having inorganic layers 60A and 60B as shown, and a single organic encapsulation layer 62A can be fabricated.

The organic thin layer ink compositions comprise polyethylene glycol di(meth)acrylate monomers, mono(meth)acrylate monomers and multifunctional crosslinking agents. As used herein, the phrase "(meth)acrylate monomer" indicates that the recited monomer may be an acrylate and/or a methacrylate. Some embodiments of the ink compositions further include crosslinking photoinitiators and/or spreading modifiers. Some of the ink compositions consist of, or consist essentially of, only the polyethylene glycol di(meth)acrylate monomers, mono(meth)acrylate monomers, multifunctional crosslinking agents and, optionally, the crosslinking photoinitiators and/or spreading modifiers.

Some embodiments of the ink composition comprise less than about 60 wt. % polyethylene glycol di(meth)acrylate monomer or less than about 55 wt. % polyethylene glycol di(meth)acrylate monomer. For example, some embodiments of the ink compositions comprise about 40-60 wt. % polyethylene glycol di(meth)acrylate monomer. This includes ink compositions that comprise about 40 wt. % to 57 wt. % polyethylene glycol di(meth)acrylate monomer, further includes ink compositions that comprise about 45 wt. % to 57 wt. % polyethylene glycol di(meth)acrylate monomer and still further includes ink compositions that comprise about 50 wt. % to 55 wt. % polyethylene glycol di(meth)acrylate monomer.

According to the present teachings, various compositions of an organic thin layer ink composition can include a polyethylene glycol dimethacrylate and/or a polyethylene glycol diacrylate having a number average molecular weight in the range from about 230 gm/mole to about 440 gm/mole as the polyethylene glycol di(meth)acrylate monomer. For example, the organic thin layer ink can include polyethylene glycol 200 dimethacrylate and/or polyethylene glycol 200 diacrylate, having a number average molecular weight of about 330 gm/mole and having the generalized structure as shown below:

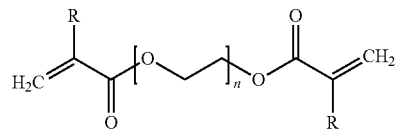

where n is on average 4 and R is independently selected from H and methyl groups.

For various embodiments of the organic thin layer ink compositions of the present teachings, polyethylene glycol 200 dimethacrylate can be the primary component, comprising between about 50 wt. % and about 57 wt. % of the ink composition.

The mono(meth)acrylate monomers participate in the polymerization of cured films made from the ink compositions primarily by providing end groups on the polymeric chains. Some embodiments of the ink composition comprise at least about 25 wt. % mono(meth)acrylate monomer or at least about 30 wt. % mono(meth)acrylate monomer. For example, some embodiments of the ink compositions comprise about 25 wt. % to 50 wt. % mono(meth)acrylate monomer. This includes ink compositions that comprise about 30 wt. % to 50 wt. % mono(meth)acrylate monomer, and further includes ink compositions that comprise about 30 wt. % to 40 wt. % mono(meth)acrylate monomer.

The mono(meth)acrylate monomers should be selected such that they are miscible with the other monomers in the ink composition, such that they are themselves soluble in the composition and do not cause the precipitation of the other acrylate or methacrylate based components from solution. Examples of suitable mono(meth)acrylate monomers include cyclic (meth)acrylates having the structure:

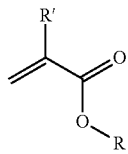

wherein the R group comprises one or more cyclic groups, which may be aromatic or non-aromatic rings, and R' is an H atom or a methyl group. The cyclic groups may be, for example, bicyclic groups comprising two fused rings. Specific examples of cyclic mono(meth)acrylate monomers include dicyclopentenyloxyethyl acrylate (DCPOEA) and isobornyl acrylate (ISOBA), the structures of which are shown below.

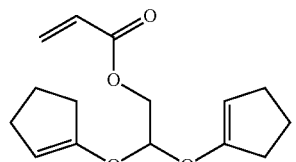

DCPOEA (viscosity: 20 cps at 23° C.);

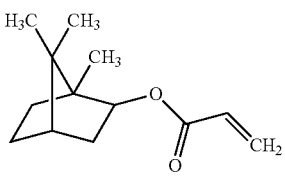

ISOBA (viscosity: 9 cps at 25° C.).

Other examples include dicyclopentenyloxyethyl methacrylate (DCPOEMA) and isobornyl methacrylate (ISOBMA). Homologs of ISOBA and ISOBMA (collectively "ISOB(M)A" homologs) in which one or more of the methyl groups on the ring is replaced by hydrogen can also be used. However, the optimal concentration of the ISOB(M)A homologs in the ink compositions may be affected by the resulting changes in the spreading properties and/or viscosities of the ink compositions containing the homologs.

Examples of suitable aliphatic mono(meth)acrylates include those having the structure:

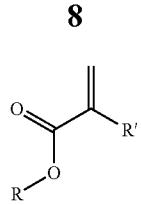

wherein R represents a straight carbon chain, such as a C12 to C18 carbon chain, for example a C16 to C18 carbon chain, and R' is an H atom or a methyl group. N-octadecyl methacrylate (OctaM), shown here, is a specific example of a monomethacrylate that can be included in the ink compositions:

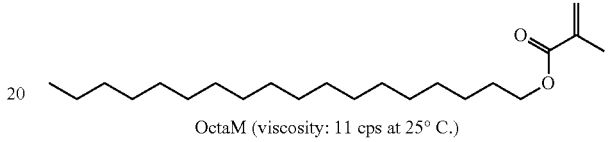

OctaM (viscosity: 11 cps at 25° C.)

N-octadecyl acrylate is another example. Some embodiments of the ink compositions comprise about 29 wt. % to about 45 wt. % of n-octadecyl (meth)acrylate, including embodiments that comprise about 29 wt. % to about 40 wt. % n-octadecyl (meth)acrylate.

The selection of the mono(meth)acrylate monomer may depend, at least in part, on the desired spreading properties of the ink composition, as discussed in greater detail below. By way of illustration only, inkjet printed droplets of various embodiments of the ink compositions undergo droplet spreading of 40% or less at a temperature of 23° C. over a period of approximately 15 minutes, as measured by the change in the diameters of the droplets printed onto a silicon (Si) substrate in the time period from 40 seconds post-printing to 15 minutes post-printing. This includes inkjet printed droplets that undergo droplet spreading of 20% or less at a temperature of 23° C. over a period of approximately 15 minutes and further includes inkjet printed droplets that undergo droplet spreading of 5% or less at a temperature of 23° C. over a period of approximately 15 minutes, as measured by the change in the diameters of the droplets printed onto a Si substrate in the time period from 40 seconds post-printing to 15 minutes post-printing The mono(meth)acrylate monomer component of the ink compositions may comprise a blend of two or more mono(meth)acrylate monomers in order to optimize the inkjet printing properties of the ink composition. For example, an ink composition that provides good jetting and film forming properties, but that undergoes insufficient spread may benefit from the addition of a second, higher spreading, mono(meth)acrylate monomer. By way of illustration, some embodiments of the ink compositions comprise a blend of two cyclic mono(meth)acrylate monomers, such as DCPOE(M)A and ISOB(M)A. In various embodiments of the ink compositions comprising a blend of a first and a second mono(meth)acrylate monomer, the mono(meth)acrylate monomer blend comprises about 15 wt. % to about 85 wt. % of the first mono(meth)acrylate monomer and about 85 wt. % to about 15 wt. % of the second mono(meth)acrylate monomer. This includes embodiments of the mono(meth)acrylate monomer blends that comprise about 40 wt. % to about 60 wt. % of the first mono(meth)acrylate monomer and about 60 wt. % to about 40 wt. % of the second mono(meth)acrylate monomer. Various embodiments of the mono(meth)acrylate monomer component of ink compositions may consist of, or consist essentially of, only cyclic mono(meth)acrylate monomers, aliphatic mono(meth)acrylate monomers, or a combination thereof. ISOBA is a highly spreading monomer and, therefore, can be combined with mono(meth)acrylate monomers, such as DCPOEA, that tend to pin droplets of the ink composition to the substrate surface in order to provide balanced spreading properties. However, because ISOBA is so highly spreading, embodiments of the ink compositions comprising a mixture ISOBA with one or more additional mono(meth)acrylate monomer will typically comprise no more than about 10 wt. % ISOBA.

The multifunctional (meth)acrylate crosslinking agents desirably have at least three reactive (meth)acrylate groups. Thus, the multifunctional (meth)acrylate crosslinking agents can be, for example, tri(meth)acrylates, tetra(meth)acrylates and/or higher functionality (meth)acrylates. Pentaerythritol tetraacrylate or pentaerythritol tetramethacrylate, di(trimethylolpropane) tetraacrylate and di(trimethylolpropane) tetramethacrylate are examples of multifunctional (meth) acrylates that can be used as a primary cross-linking agent. The term 'primary' is used here to indicate that other components of the ink compositions may also participate in crosslinking, although that is not their main functional purpose. For various embodiments of an organic thin layer ink composition, multifunctional (meth)acrylate crosslinking agents can comprise between about 4-10 wt. % of an ink composition. A generalized structure for pentaerythritol tetraacrylate or pentaerythritol tetramethacrylate is shown below.

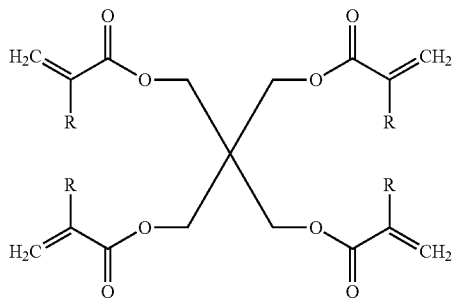

where R is independently selected from H and methyl groups.

A generalized structure for di(trimethylolpropane) tetraacrylate or di(trimethylolpropane) tetramethacrylate is shown below.

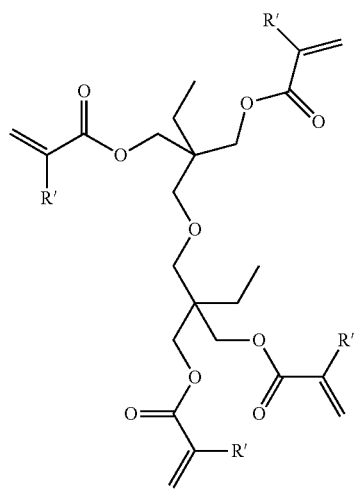

where R' is independently selected from H and methyl groups.

According to the present teachings, a spreading modifier can, optionally, be used to tune the spreading characteristics of various embodiments of the organic thin layer ink compositions. However, in some embodiments of the ink compositions, the mono(meth)acrylate monomers provide adequate spreading and, therefore, no additional spreading modifiers are needed. The spreading modifier is a liquid having a lower surface tension than the polyethylene glycol di(meth)acrylate of the ink composition at the printing temperatures. By way of illustration, various embodiments of the ink compositions comprise a spreading modifier having a viscosity in the range from about 10 cps to about 20 cps at 22° C., including about 14 cps to about 18 cps at 22° C., and a surface tension in the range from about 35 dynes/cm to about 39 dynes/cm at 22° C. This includes embodiments of the ink compositions that comprise a spreading modifier having a viscosity in the range from about 14 cps to about 16 cps at 22° C. and a surface tension in the range from about 35 dynes/cm to about 38 dynes/cm at 22° C. Methods for measuring viscosities and surface tensions are well known and include the use of commercially available rheometers (e.g., a DV-I Prime Brookfield rheometer) and tensiometers (e.g., a SITA bubble pressure tensiometer). In some embodiments of the ink compositions, the spreading modifier comprises a multifunctional, such as difunctional, acrylate monomer or oligomer or methacrylate monomer or oligomer. Acrylate and methacrylate based spreading modifiers may be advantageous because they are generally compatible with the polyethylene glycol di(meth) acrylate monomers, the mono(meth)acrylate monomers and the (meth)acrylate based multifunctional crosslinking agents of the ink compositions. As such, their use will not cause the precipitation of the other acrylate or methacrylate based components from solution. In addition, acrylate and methacrylate based spreading modifiers can participate in the crosslinking of the polyethylene glycol di(meth)acrylate. That is, the spreading modifier(s) can be incorporated into the polymer through similar chemistry, so as not to remain as contaminants after UV curing. Various embodiments of organic thin layer ink compositions comprise the spreading modifiers in amounts of up to about 15 wt. %. This includes embodiments of the organic thin layer ink compositions that comprise the spreading modifiers in amounts in the range from about 1 wt. % to about 15 wt. %.

In some embodiments of the ink compositions, the spreading modifier comprises an alkoxylated aliphatic diacrylate. The formula for an alkoxylated aliphatic diacrylate can be represented as follows:

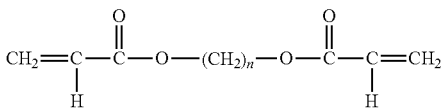

where n can be between 3 to 12.

As various embodiments of the organic thin layer ink compositions can utilize various alkoxylated aliphatic diacrylate materials for adjusting the spreading properties of an ink formulation on a substrate, various embodiments of the organic thin layer ink compositions of the present teachings can have up to about 15 wt. % of an alkoxylated aliphatic diacrylate component in a formulation. Various alkoxylated aliphatic diacrylate materials can be provided by Sartomer Corporation. For example, candidate Sartomer products can include Sartomer product number SR-238B, which is 1,6 hexanediol diacrylate with a surface tension of about 35 dyne/cm at 22° C., as well as Sartomer product number SR-9209A, which is described as a proprietary alkoxylated aliphatic diacrylate and has a surface tension of about 35 dynes/cm at 22° C. and a viscosity of about 15 cps at 22° C. For various embodiments of the organic thin layer ink compositions, the aliphatic portion of an alkoxylated aliphatic diacrylate component can be between 3 to 12 repeating methylene units. For various embodiments of the organic thin layer ink compositions, the aliphatic portion of an alkoxylated aliphatic diacrylate component can be between 4 to 6 repeating methylene units.

In addition to various alkoxylated aliphatic diacrylate components, various embodiments of the organic thin layer ink compositions can use alkoxylated aliphatic dimethacrylate components to adjust the spreading characteristics of various formulations. Various embodiments of the organic thin layer ink compositions of the present teachings can have up to about 15 wt. % of an alkoxylated aliphatic dimethacrylate component in a formulation. For various embodiments of the organic thin layer ink compositions, the aliphatic portion of an alkoxylated aliphatic dimethacrylate component can be between 3 to 12 repeating methylene units. For various embodiments of the organic thin layer ink compositions, the aliphatic portion of an alkoxylated aliphatic dimethacrylate component can be between 4 to 6 repeating methylene units. The formula for an alkoxylated aliphatic dimethacrylate can be represented as follows:

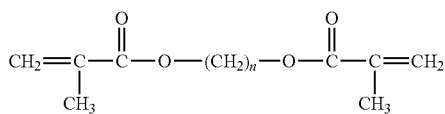

where n can be between 3 to 12.

Regarding initiation of the polymerization process, various embodiments of the organic thin layer ink compositions of the present teachings can utilize numerous types of photoinitiators for initiating the polymerization process. In various embodiments the photoinitiators are present in amounts in the range from about 0.1 wt. % to about 10 wt. %, for example, from about 0.1 wt. % to about 8 wt. %. This includes embodiments in which the photoinitiators are present in amounts in the range from about 1 wt. % to about 6 wt. %, further includes embodiments in which the photoinitiators are present in amounts in the range from about 3 wt. % to about 6 wt. %, and still further includes embodiments in which the photoinitiators are present in amounts in the range from about 3.75 wt. % to about 4.25 wt. %. However, amounts outside of these ranges can also be used. The photoinitiator may be a Type I or a Type II photoinitiator. Type I photoinitiators undergo radiation-induced cleavage to generate two free radicals, one of which is reactive and initiates polymerization. Type II photoinitiators undergo a radiation-induced conversion into an excited triplet state. The molecules in the excited triplet state then react with molecules in the ground state to produce polymerization initiating radicals.

The specific photoinitiators used for a given ink composition are desirably selected such that they are activated at wavelengths that are not damaging to the OLED materials. For this reason, various embodiments of the ink compositions include photointiators that have a primary absorbance with a peak in the range from about 368 to about 420 nm. The light source used to activate the photoinitiators and induce the curing of the ink compositions is desirably selected such that the absorbance range of the photoinitiator matches or overlaps with the output of the light source, whereby absorption of the light creates free radicals that initiate polymerization. Suitable light sources may include mercury arc lamps and UV light emitting diodes.

An acylphosphine oxide photoinitiator can be used, though it is to be understood that a wide variety of photoinitiators can be used. For example, but not limited by, photoinitiators from the α-hydroxyketone, phenylglyoxylate, and α-aminoketone classes of photoinitiators can also be considered. For initiating a free-radical based polymerization, various classes of photoinitiators can have an absorption profile of between about 200 nm to about 400 nm. For various embodiments of the ink compositions and methods of printing disclosed herein, 2,4,6-trimethylbenzoyl-diphenylphosphine oxide (TPO) and 2,4,6-trimethylbenzoyl-diphenyl phosphinate have desirable properties. For various embodiments of the ink compositions and printing methods of the present teaching, an acylphosphine oxide photoinitiator can be about 0.1-5 wt. % of a formulation. Examples of acylphosphine photoinitiators include Irgacure® TPO (also previously available under the tradename Lucirin® TPO) initiators for UV curing sold under the tradenames Irgacure® TPO, a type I hemolytic initiator which; with absorption @380 nm; Irgacure® TPO-L, a type I photoinitiator that absorbs at 380 nm; and Irgacure® 819 with absorption at 370 nm. By way of illustration, a light source emitting at a nominal wavelength in the range from 350 nm to 395 nm at a radiant energy density of up to 1.5 J/cm$^2$ could be used to cure an ink composition comprising a TPO photoinitiator. Using the appropriate energy sources, high levels of curing can be achieved. For example, some embodiments of the cured films have a degree of curing of 90% or greater, as measured by Fourier Transform Infrared (FTIR) spectroscopy.

The appropriate amount of photoinitiator to include in a given ink composition will depend on the nature of the selected photoinitiator, crosslinking agent and, if present, spreading modifier. However, the amount of photoinitiator is desirably selected to minimize the volume change that takes place from the time the ink composition is printed to the time the ink composition is cured into a solid film. An accurate test for measuring the volume change of ink compositions that takes place during the curing and that allows for the precise determination of the appropriate amount of photoinitiator to be included in a given ink composition in order to minimize that volume change can be carried out as follows. A known volume of an ink composition is carefully dispensed into the bottom of a container with a known volume marking (for example, a volumetric flask). The ink composition in the container is then exposed to a radiation source that induces crosslinking and cures the ink composition into a solid film. A volume of deionized (DI) water corresponding to the volume indicated by the volume marking on the container is then dispensed into the container with the cured film. The portion of the DI water above the volume marking is then extracted from the container and weighed to determine the volume of the cured film. By way of illustration, the test can be carried out in a laboratory as follows. Place a 5 mL glass volumetric flask into a glove box, along with a UV-curable ink composition, and a hand-held ultraviolet (UV) lamp. Using an Eppendorf pipette and an appropriate tip, carefully dispense 500 μL of the ink composition into the volumetric flask without touching the tip to the side walls, such that all of the ink composition is dispensed into the bottom of flask. Place the volumetric flask over the UV lamp and turn on the lamp to an appropriate wavelength setting (e.g., 365 nm) for a time sufficient to fully cure the ink composition (e.g., about 180 seconds). Note: the operator should be wearing UV protective glasses. After the ink composition has cured into a solid film, turn off the lamp and place a stopper on flask. Take the stoppered flask with the cured film out of the glove box. Place the flask on a weighing balance, without the glass stopper, and measure its tare weight. Using a Pasteur pipette, carefully dispense (avoiding the side walls) precisely 5 grams of DI water into the volumetric flask. Then remove the flask from the balance, place an empty dry vial on the balance and measure its tare weight. Using a fresh dry Pasteur pipette carefully extract the portion of DI water from volumetric flask that is above the 5 mL mark. At the endpoint of the extraction, the low point of the meniscus of the water must be aligned with the 5 mL mark, as determined by visual inspection. Transfer the full amount of the extracted DI water into the empty vial and measure its weight (w1). The percent volume change (e.g., volume reduction) resulting from the curing of the dispensed ink composition can be calculated using the following equation:

Volume change %=100−(($w1$ grams/0.5 grams)× 100).

Generally, for ink compositions useful for inkjet printing applications, the surface tension, viscosity and wetting properties of the ink compositions should be tailored to allow the compositions to be dispensed through an inkjet printing nozzle without drying onto or clogging the nozzle at the temperature used for printing (e.g., room temperature; ~22° C.). Once formulated, various embodiments of the organic thin layer ink compositions can have a viscosity of between about 10 cps and about 25 cps (including, for example, between about 17 cps and about 21 cps) at 22° C. and a surface tension of between about 32 dynes/cm and about 45 dynes/cm (including, for example, between about 38 dynes/cm and about 41 dynes/cm) at 22° C. As jetting temperatures can be between about 22° C. to about 40° C., over such a temperature range, various embodiments of organic thin layer ink formulations can have a viscosity of between about 7-25 cps (including, for example, between about 9 cps and about 19 cps) and a surface tension of between about 30 dynes/cm and about 45 dynes/cm in the temperature range of the printhead.

Given that the initiation of polymerization can be induced by light, inks can be prepared to prevent exposure to light. With respect to preparation of organic thin layer ink compositions of the present teachings, in order to ensure the stability of various compositions, the compositions can be prepared in a dark or very dimly lit room or in a facility in which the lighting is controlled to exclude wavelengths that would induce polymerization. Such wavelengths generally include those below about 500 nm. For example, for the preparation of an embodiment of an organic thin film ink formulation, in a fashion that protects the direct exposure to light, the lid of a clean amber vial (for example, Falcons, VWR trace clean) can be removed and then can be placed on a balance; and tared. First, a desired amount of a photoinitiator can be weighed into the vial. Then, after the addition of the spreading modifier component, the polyethylene di(meth)acrylate can be weighed into the vial. Next, the mono(meth)acrylate monomer can be weighed into the vial. Finally, the crosslinking agent can be weighed into the vial. (The preceding description lays out one protocol for sequentially incorporating the various components into an ink composition. Other protocols can be used.) Regarding mixing to provide uniform concentration of components, a Teflon® coated magnetic stir bar can be inserted into the vial and the cap of vial secured. The solution can then be stirred, for example, for 30 minutes at temperatures in the range from room temperature to 50° C. and 600-1000 rpm. Thereafter, the ink composition can be filtered, for example, through a 0.1 µm or 0.45 µm PTFE syringe filter or vacuum or pressure filter, followed by sonication for 30 minutes at ambient temperature. The ink composition is then ready for use and should be stored away from light, for example, in a compressed dry air glove box. Various embodiments of an organic thin film ink preparation as described can have a viscosity of between about 17 cps and about 21 cps at 22° C. and a surface tension of between about 34 dynes/cm and about 41 dynes/cm at 22° C.

Once the ink compositions are prepared, they can be dehydrated by mixing in the presence of molecular sieve beads for a period of a day or more and then stored under a dry, inert atmosphere, such as a compressed dry air atmosphere. The ink composition should be stored in amber light or in the dark in order to avoid or minimize premature polymerization. For example, the ink composition can be stored in an amber vial. Drying and storage in a dry, inert atmosphere can keep the water content of the ink compositions below about 400 ppm (including, for example, below about 200 ppm), which is desirable for ink jet printing, until the compositions are ready for use. In order to reduce the water content of the ink compositions, a dehydration process can be carried out, wherein molecular sieve beads (e.g., 3 Angstrom; 10% w/w) are added to the composition and the composition is placed on a roller to provide gentle agitation for a period of time (e.g., 5 days), after which the ink composition can be filtered and transferred into a dry atmosphere, such as a compressed dry air atmosphere, and aliquoted into amber vials, followed by capping the vials, to provide a dry air headspace in the vials. The same procedure can be used to produce the same results with a compressed dry air headspace.

The ink compositions, particularly those stored under a dry, inert atmosphere at room temperature (22° C.), can be stable for long periods of time, as determined by the lack of precipitation or separation under visual inspection and the stabilities in their room temperature viscosities and surface tensions. No significant changes were recorded in viscosity and surface tension of the ink compositions; any changes are deemed to be within measurement errors for at least 160 days at room temperature under compressed dry air atmosphere in the dark.

The ink compositions can be printed using a printing system, such as that described in U.S. Pat. No. 8,714,719, which is incorporated herein in its entirety. The films can be cured in an inert nitrogen environment using UV radiation. The cured films display high transparency, as well as uniform thickness.

Various embodiments of the present ink compositions can be inkjet printed into thin films that are continuous and have well-defined edges on such substrates as glass, silicon, and/or silicon nitride. This includes embodiments of the ink compositions that can be printed into continuous thin films having well-defined edges and thicknesses of no greater than about 6 µm, further includes embodiments of the ink compositions that can be printed into continuous thin films having well-defined edges and thicknesses of no greater than about 4 µm, further includes embodiments of the ink compositions that can be printed into continuous thin films having well-defined edges and thicknesses of no greater than about 2 μm, and further includes embodiments of the ink compositions that can be printed into continuous thin films having well-defined edges and thicknesses of no greater than about 1 μm. For example, the ink compositions can be used to print thin films having thicknesses in the range from about 1 μm to about 10 μm, or thicker, including thin films having thicknesses in the range from about 2 μm to about 8 μm. These thin films can be achieved with film thickness variation of, for example, 5% or lower. For applications where very thin films (e.g., films having a thickness of 2 μm or less) are desired or required, more highly spreading ink compositions should be used. Generally, these ink composition will comprise highly spreading mono(meth)acrylates, such as n-octadecyl (meth)acrylate or ISOBA. For applications where a thicker film is suitable, the ink compositions may comprise mono(meth)acrylates that have a higher tendency to pin the ink compositions to the substrate surface, such as DCPOEA.

As discussed below, a key property of the ink compositions is jettability, which depends on the overall viscosity of the ink compositions. Because the mono(meth)acrylate monomers make up a substantial portion of the ink composition, those monomers should have viscosities that provide a jettable ink composition when combined with the other components of the ink composition. Typically, suitable mono(meth)acrylate monomers will have a viscosity in the range from about 10 cps to about 27 cps at 22° C. If a mixture of mono(meth)acrylate monomers is used, it is the mixture that will have a viscosity in the range from about 10 cps to about 27 cps at 22° C. Thus, a combination of mono(meth)acrylate monomers can have a viscosity in the range from about 10 cps to about 27 cps at 22° C., even if one of the mono(meth)acrylate monomers contained therein has a viscosity of less than 10 cps at 22° C. or greater than 27 cps at 22° C.

The following considerations can provide some additional general guidance in the selection of mono(meth)acrylate monomers having suitable structures or properties to achieve an ink composition with desired spreading properties (e.g., high spreading or low spreading). However, these guidelines are not intended to provide rigid requirements and mono (meth)acrylate monomers that are suitable for use in the present ink compositions may exhibit spreading properties that deviate from the guidelines provided here. Some embodiments of mono(meth)acrylate monomers that are highly spreading comprise linear carbon chains with a high carbon content and few, if any, heteroatoms (e.g., oxygen atoms), whereas mono(meth)acrylate monomers that tend to pin droplets of the ink compositions to the surface and resist spreading may be characterized by a relatively high heteroatom content and/or few, if any linear carbon chains. By way of illustration, OctaM, which has a long carbon-rich chain without any heteroatoms, can be used to form a highly spreading ink composition. In addition, the tendency of a mono(meth)acrylate to impart uniform spreading to an ink may be affected by its structural similarity to the other primary polymers in the composition. Thus, when substantial quantities of two or more mono(meth)acrylate monomers are combined, it can be advantageous to use mono (meth)acrylate monomers with common structural features, such as cyclic groups. By way of illustration, ISOBA can be combined with DCPOEA, both of which have bicyclic structures, to increase the spreadability of DCPOEA-containing ink compositions.

Figure 2A:
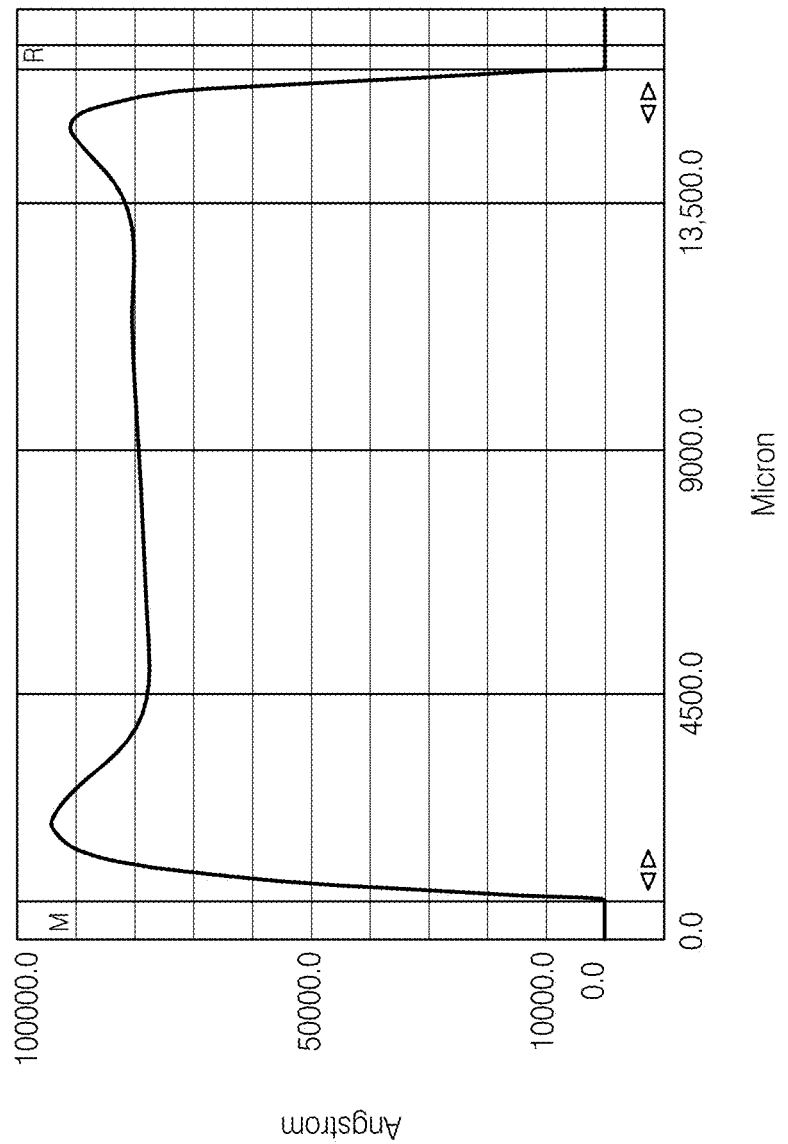
FIG. 2A and FIG. 2B are film profiles of a polymeric thin film formed on a substrate, according to various embodiments of compositions, systems and methods of the present teachings.
Figure 2B:
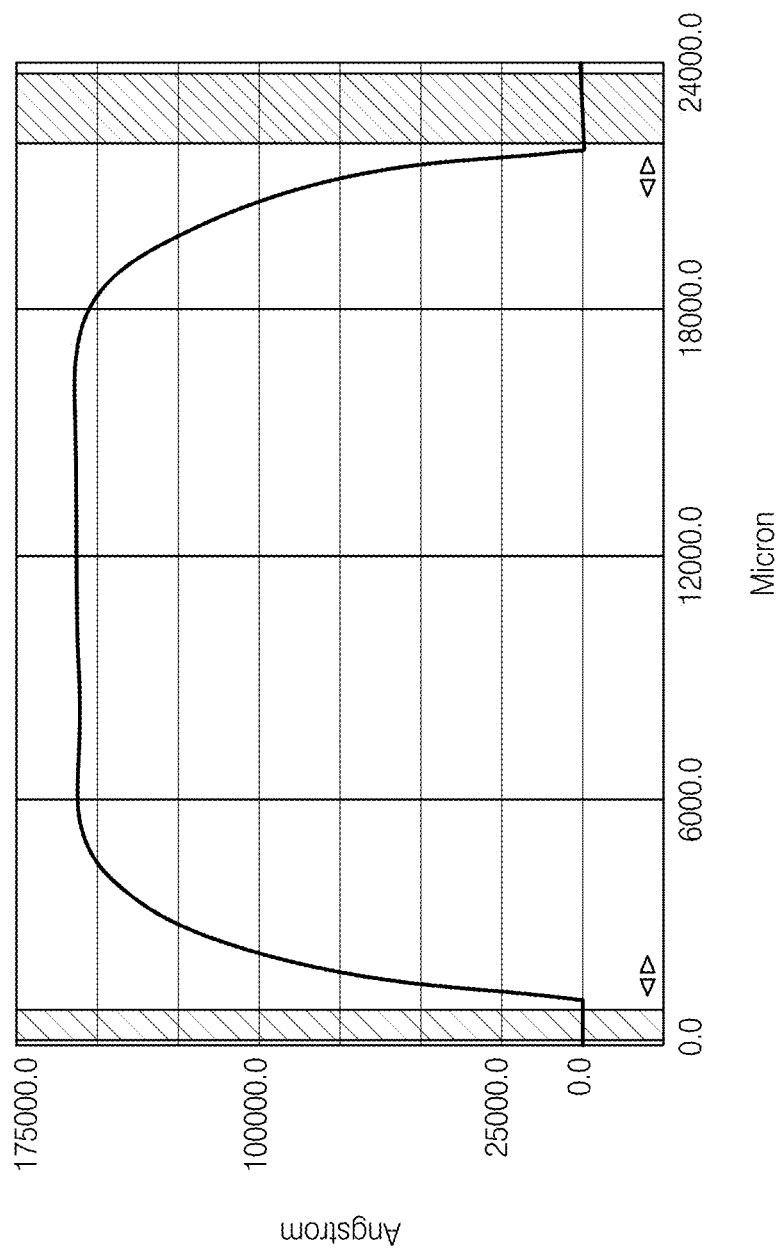

Film thickness and uniformity can be measured using a profilometer tool, such as a Veeco Dektak Profilometer tool. To carry out a thickness measurement, a scratch can be made on the film using, for example, a sharp needle on a substrate. Then the substrate can be placed on the tool to measure the height of the scratch well, which represents the thickness of the film printed on the substrate. To illustrate the concept of film uniformity, FIG. 2A displays a film of 8 μm thickness, which was printed without incorporating edge compensation, and shows uniformity except at the film edges, as expected. FIG. 2B is a film of 16 μm thickness, which was printed using edge compensation, and shows uniformity, as expected. Methods for carrying out edge compensation on printed films are described in U.S. Pat. No. 8,995,022, issued on Mar. 31, 2015 and entitled Ink-Based Layer Fabrication Using Halftoning to Control Thickness, which is incorporated herein by reference. Further by way of illustration, some embodiments of the cured films made with the present ink compositions can have a transmission of 90% or greater at wavelengths of 550 nm and above. This includes cured films having a transmission of 99% or greater, and 99.5% or greater, at wavelengths of 550 nm and above.

The ink compositions are designed to be applied by inkjet printing and are, therefore, characterized by jettability, wherein a jettable ink composition displays constant, or substantially constant, drop velocities, drop volumes and drop trajectories over time when jetted continuously through the nozzle of a printhead. In addition, the ink compositions are desirably characterized by good latency properties, where latency refers to the time that nozzles can be left uncovered and idle before there is a significant reduction in performance, for instance a reduction in drop velocity or volume and/or a change in trajectory that will noticeably affect the image quality. Various embodiments of the present ink compositions are characterized by stable jetting for periods of at least 15 min and latency times of at least 15 minutes.

The suitability of an ink composition for inkjet printing applications can be further measured by its maximum stable jetting frequency through a nozzle of an inkjet printhead. An ink composition that displays stable jetting has constant, or substantially constant, drop velocities, drop volumes and drop trajectories over a range of jetting frequencies. Beyond the ink composition's stable jetting frequency range, however, its drop velocity, drop volume and/or drop trajectory become erratic with increasing jetting frequency. In order to provide an ink composition with a stable jetting frequency, it is desirable to formulate the ink compositions from components that themselves have good jetting properties. Thus, in some embodiments of the ink compositions the spreading modifier is selected such that it is characterized by a high jetting stability. Various embodiments of the present ink compositions comprise spreading modifiers with maximum stable jetting frequencies of at least 23 kHz at 22° C. This includes embodiments of the ink compositions that comprise spreading modifiers having maximum stable jetting frequencies of at least 24 kHz at 22° C. and further includes embodiments of the ink compositions that comprise spreading modifiers having maximum stable jetting frequencies of at least 25 kHz at 22° C.

Figure 9A:
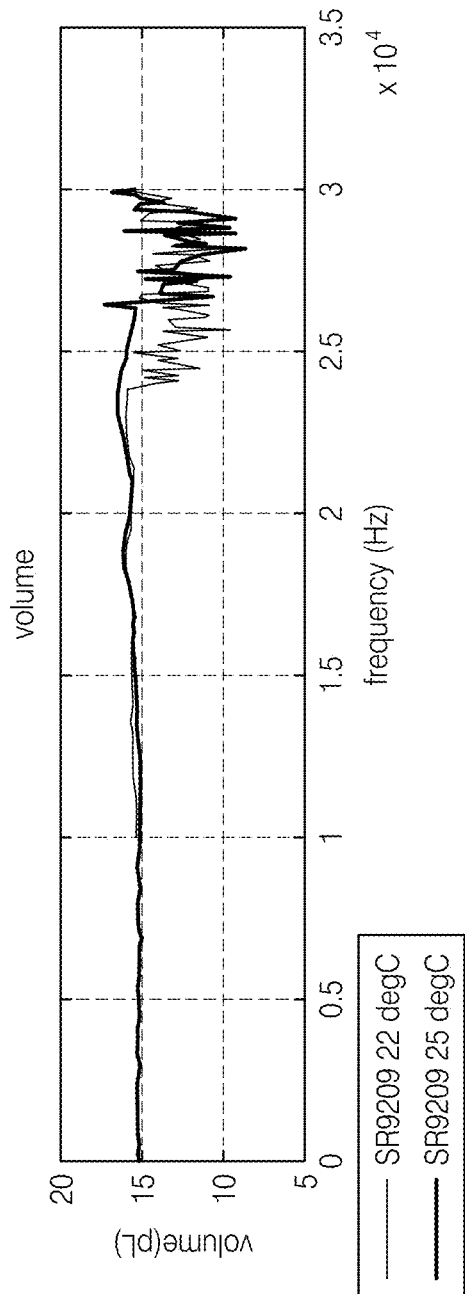
FIG. 9A is a graph of the drop volume as a function of jetting frequency at 22° C. and 25° C. for a spreading modifier.
Figure 9B:
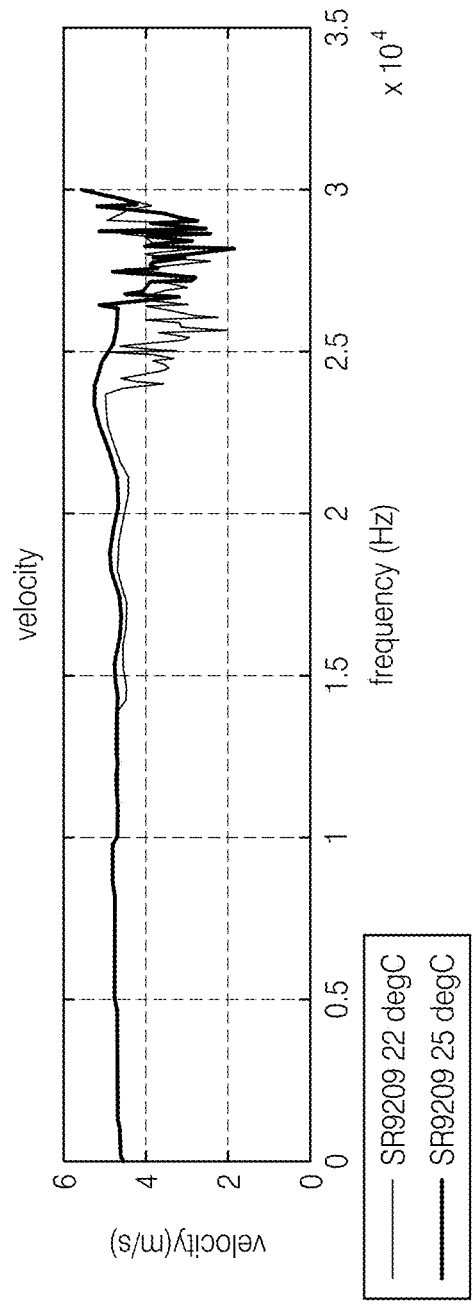
FIG. 9B is a graph of the drop velocity as a function of jetting frequency at 22° C. and 25° C. for a spreading modifier.
Figure 9C:
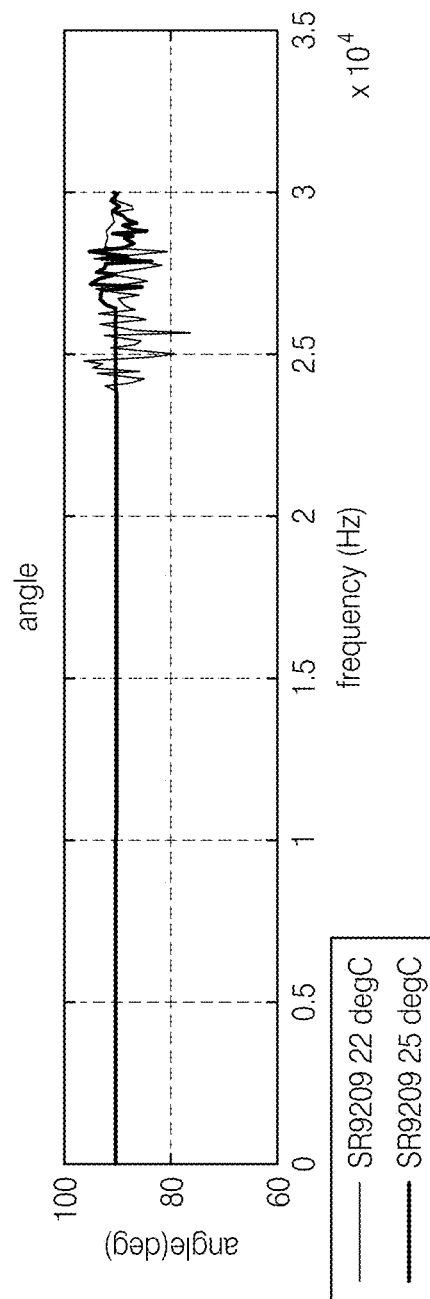
FIG. 9C is a graph of the drop trajectory as a function of jetting frequency at 22° C. and 25° C. for a spreading modifier.

Stable jetting through an inkjet nozzle is illustrated in FIGS. 9(A), 9(B) and 9(C), which show the effect of increased jetting frequency on drop volume, drop velocity and drop trajectory (angle), respectively, for the spreading modifier SR-9209A that displays stable jetting up to a jetting frequency of about 24 kHz at 22° C. and up to about 26 kHz at 25° C. The frequency responses shown in FIGS. 9(A) through 9(C) were measured by loading the SR-9209A into a printhead that is coupled with a drop measuring instrument. A waveform for firing is developed and the pulse times and voltages are adjusted and optimized to establish a stable jetting range. For example, ink jet tests can be conducted to assess the print performance of a spreading modifier by examining the effects of changing the frequency on drop volume, drop velocity and drop trajectory at 22° C. and 25° C. Examples of results from this type of frequency response test, after optimizing the pulse times and voltages, are illustrated in the graphs of FIG. 9(A) through 9(C), which show the frequency response of drop volume, velocity and trajectory respectively, for the SR-9209A. The tests were run using a Dimatix™ SX3 printhead and a JetXpert shadowgraphy setup by ImageXpert® as a drop measuring instrument.

The jetting frequency response of a given composition, such as a spreading modifier, may display some undulating variation in drop volume and drop velocity as the jetting frequency increases, but prior to the onset of the erratic jetting frequency response that characterizes unstable jetting. It is desirable for a composition to minimize the extent of these drop volume and velocity variations in order to provide uniform and reproducible deposition even at the higher frequency end of the composition's stable jetting frequency range. Various embodiments of the present ink compositions comprise spreading modifiers that undergo drop volume variations of no more than about 15% up to their maximum stable jetting frequency at 22° C. This includes ink compositions that comprise spreading modifiers that undergo drop volume variations of no more than about 12% up to their maximum stable jetting frequency at 22° C. and further includes ink compositions that comprise spreading modifiers that undergo drop volume variations of no more than about 10% up to their maximum stable jetting frequency at 22° C. Various embodiments of the present ink compositions comprise spreading modifiers that undergo drop velocity variations of no more than about 15% up to their maximum stable jetting frequency at 22° C. This includes ink compositions that comprise spreading modifiers that undergo drop velocity variations of no more than about 12% up to their maximum stable jetting frequency at 22° C. and further includes ink compositions that comprise spreading modifiers that undergo drop velocity variations of no more than about 10% up to their maximum stable jetting frequency at 22° C.

Figure 10A:
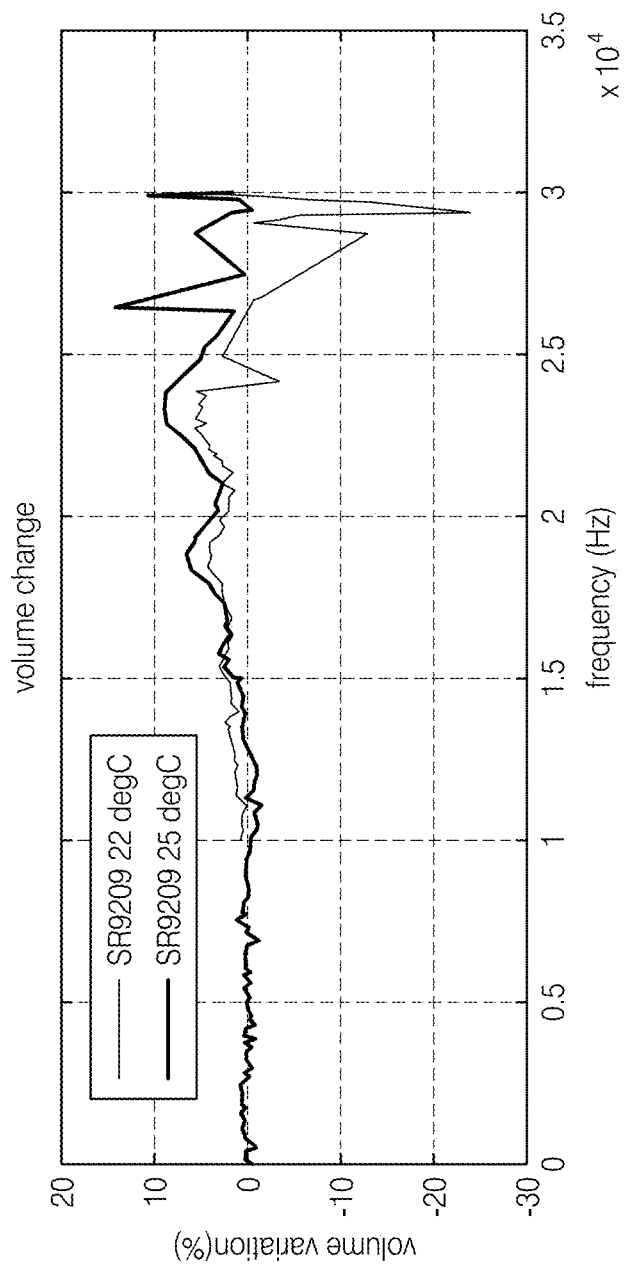
FIG. 10A is a graph of the drop volume variation as a function of jetting frequency at 22° C. and 25° C. for a spreading modifier.
Figure 10B:
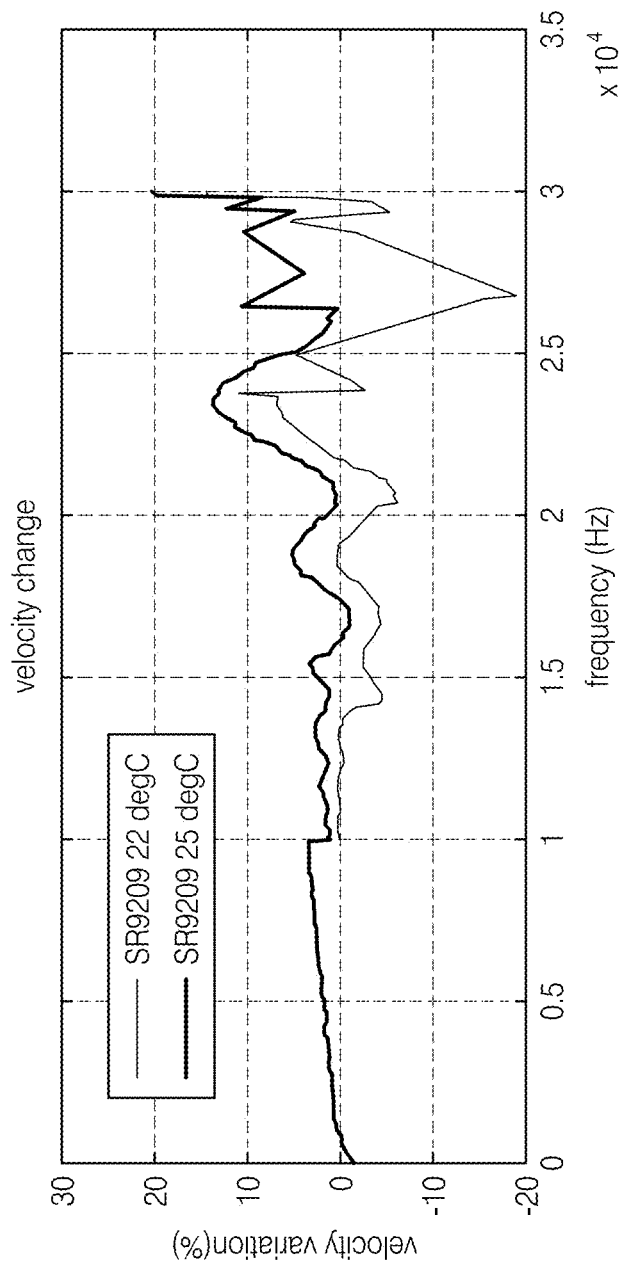
FIG. 10B is a graph of the drop velocity variation as a function of jetting frequency at 22° C. and 25° C. for a spreading modifier.
Figure 11B:
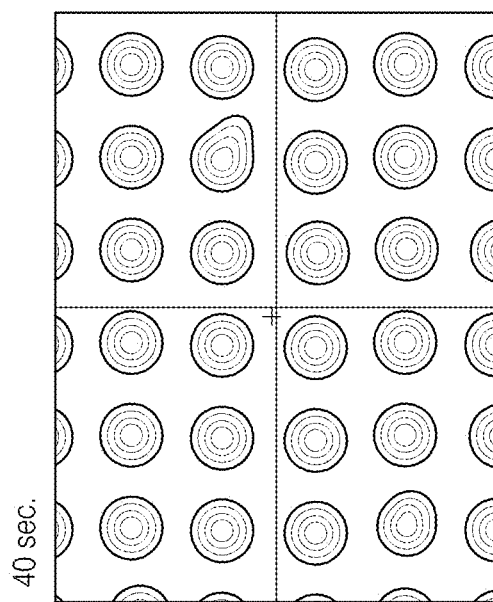
FIG. 11B is a line drawing reproducing the image of FIG. 11A.
Figure 11A:
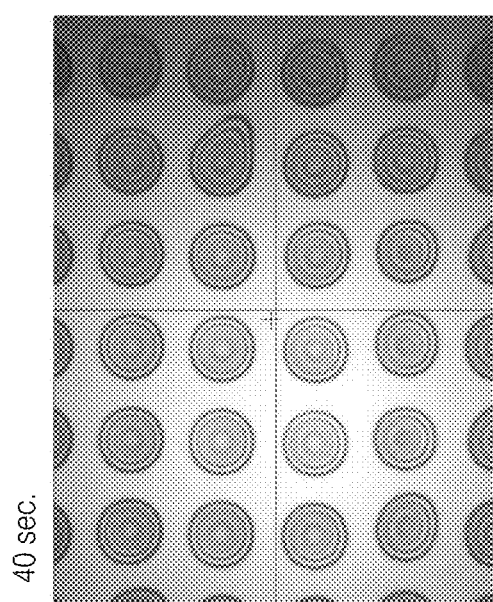
FIG. 11A is an image of droplets of ink composition Formulation 3 40 seconds after printing.
Figure 11D:
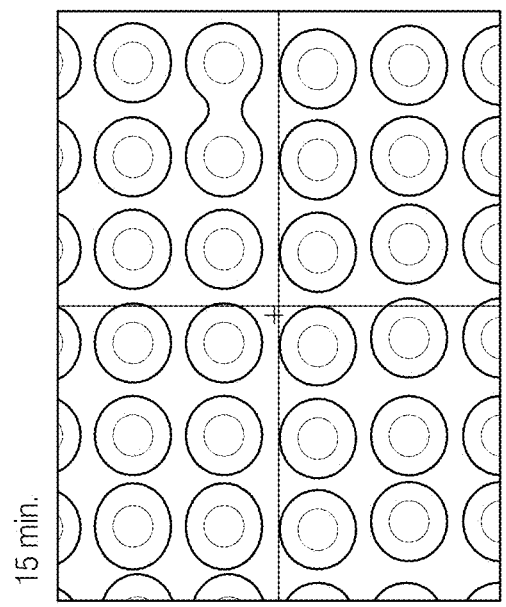
FIG. 11D is a line drawing reproducing the image of FIG. 11C.
Figure 11C:
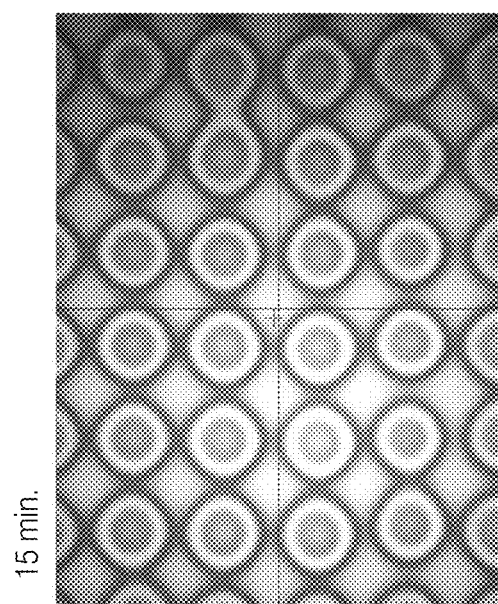
FIG. 11C shows the droplets of FIG. 11A 15 minutes after printing.
Figure 12B:
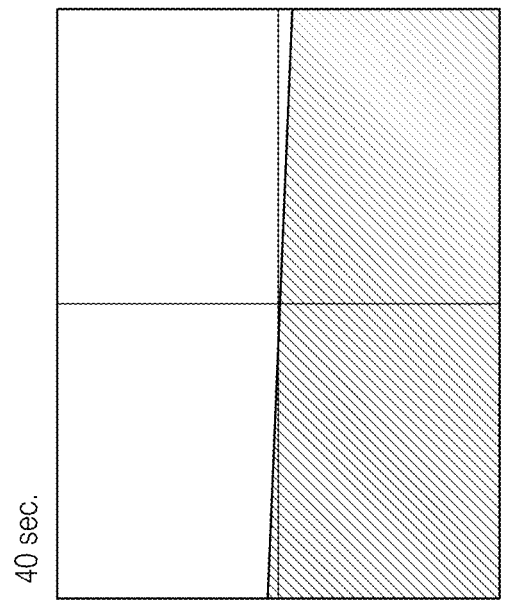
FIG. 12B is a line drawing reproducing the image of 12A.
Figure 12A:
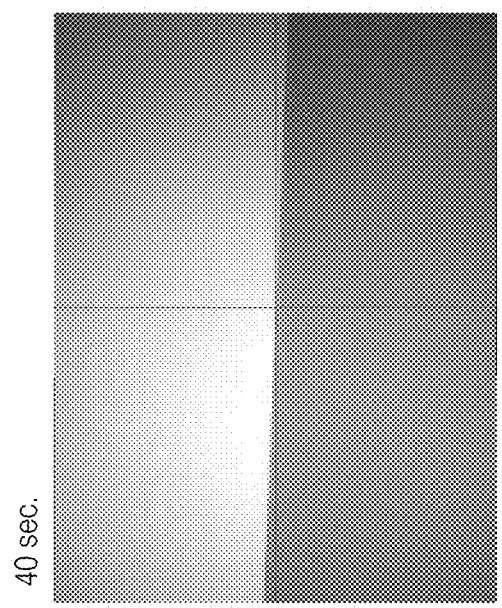
FIG. 12A is an image of the print edge for ink composition Formulation 3 40 seconds after printing.
Figure 12D:
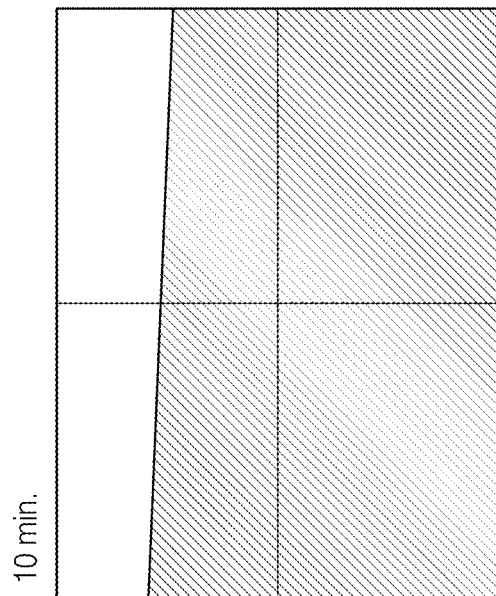
FIG. 12D is a line drawing reproducing the image of FIG. 12C.
Figure 12C:
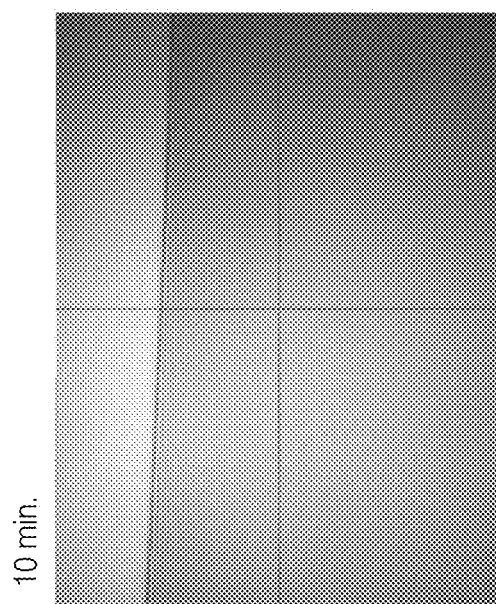
FIG. 12C shows the print edge of FIG. 12A 10 minutes after printing.
Figure 13B:
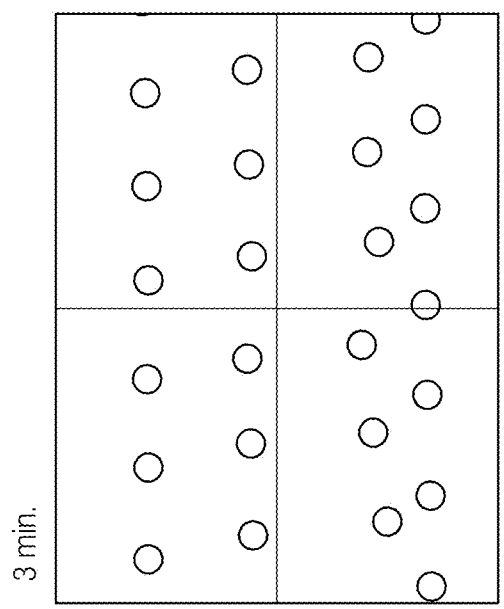
FIG. 13B is a line drawing reproducing the image of FIG. 13A.
Figure 13A:
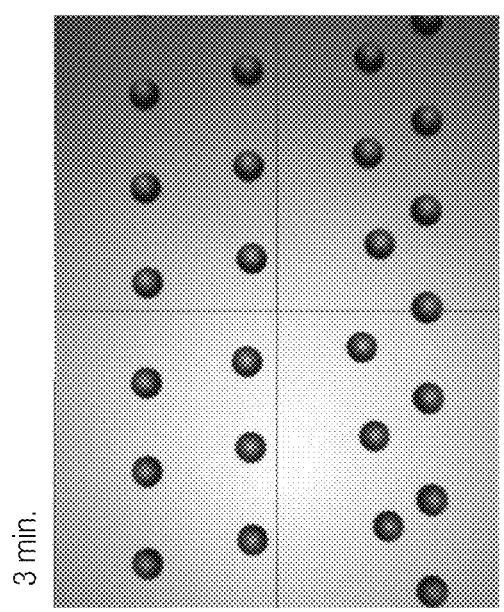
FIG. 13A is an image of droplets of ink composition Formulation 5 three minutes after printing.
Figure 13D:
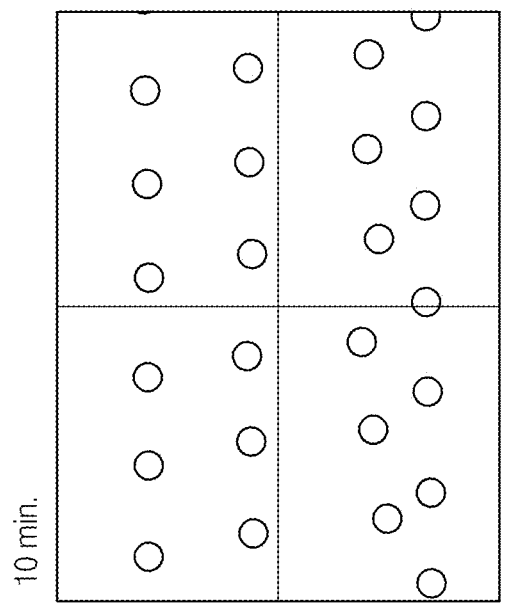
FIG. 13D is a line drawing reproducing FIG. 13C.
Figure 13C:
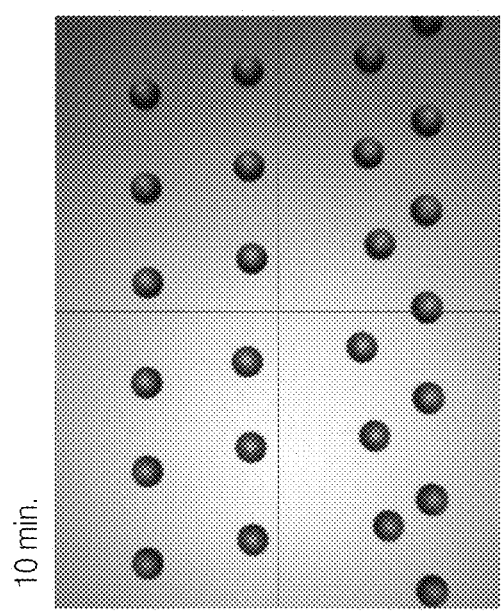
FIG. 13C shows the droplets of FIG. 13A 10 minutes after printing.
Figure 14B:
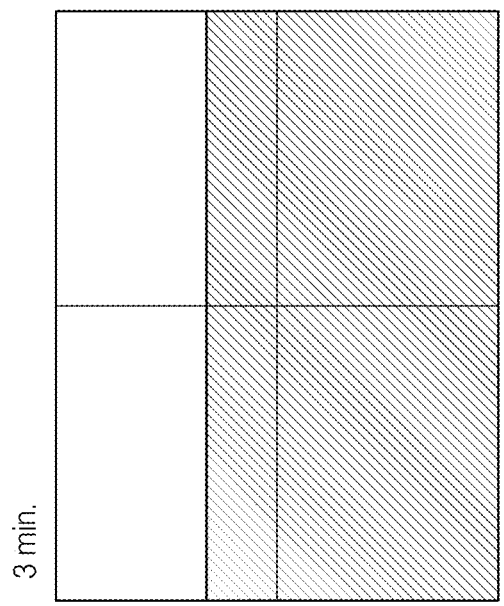
FIG. 14B is a line drawing reproducing FIG. 14A.
Figure 14A:
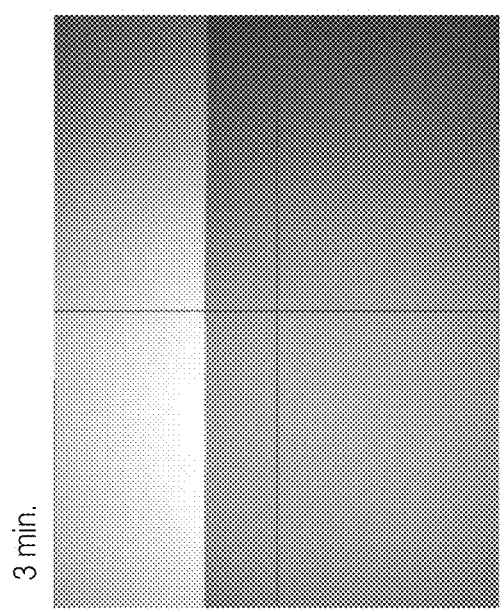
FIG. 14A is an image of the print edge for ink composition Formulation 5 three minutes after printing.
Figure 14D:
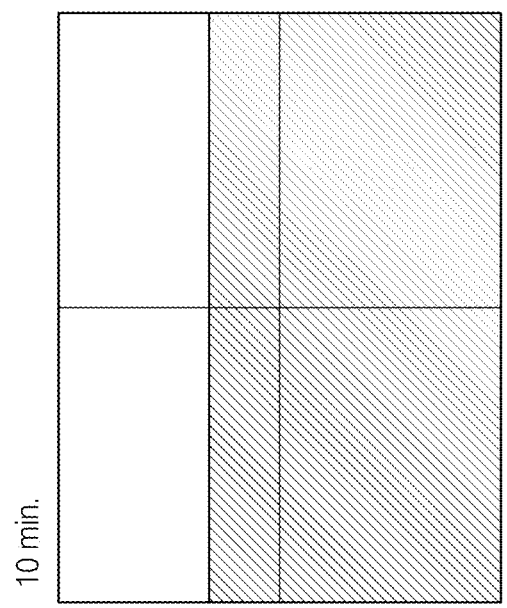
FIG. 14D is a line drawing reproducing FIG. 14C.
Figure 14C:
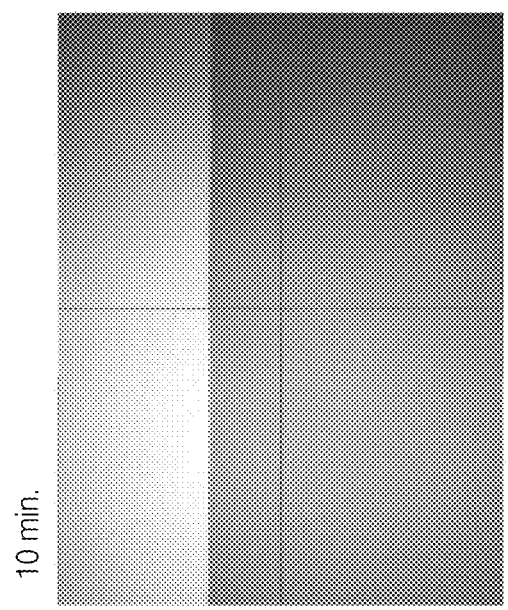
FIG. 14C shows the print edge of FIG. 14A ten minutes after printing.
Figure 15B:
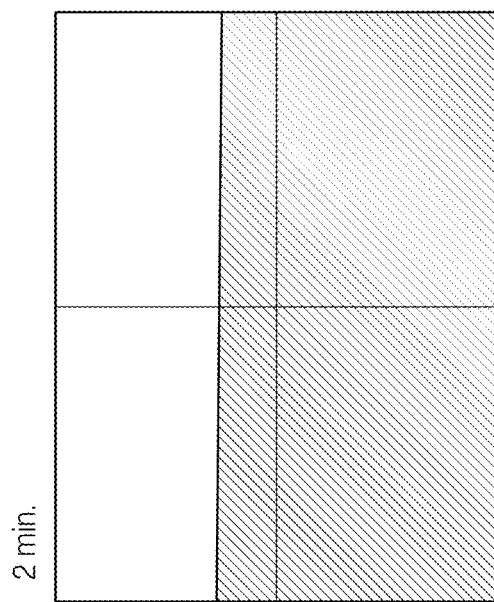
FIG. 15B is a line drawing representing FIG. 15A.
Figure 15A:
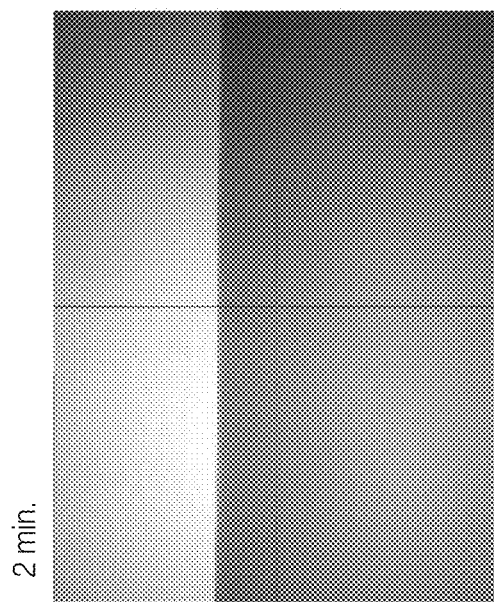
FIG. 15A is an image of the print edge for ink composition Formulation 6 two minutes after printing.
Figure 15D:
FIG. 15D is a line drawing reproducing FIG. 15C.
Figure 15C:
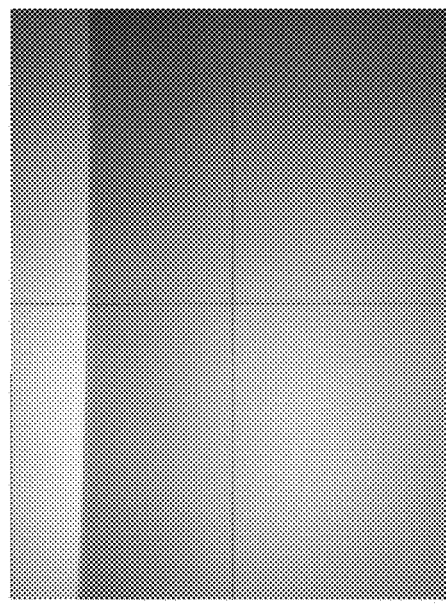
FIG. 15C shows the print edge of FIG. 15A three minutes after printing.

Drop volume and velocity variations as a function of jetting frequency at 22° C. and 25° C. are illustrated in FIGS. 10(A) and 10(B), which show the drop volume and drop velocity variations, respectively, for the SR-9209A of FIGS. 9(A)-9(C). The SR-9209A has a drop volume variation of no greater than about 10% and a drop velocity variation of no greater than about 12% up to the maximum stable jetting frequency at 25° C. The formulated ink compositions are also capable of stable jetting at high frequencies at room temperature and even higher jetting temperatures.

Example Ink Compositions

Latency time is the time between the end of jetting and the onset of the drying of the ink composition in the uncapped nozzle, which results in improper droplet firing. Latency testing can be carried out by: confirming that all nozzles are firing; stopping the jetting for 15 min; resuming jetting without priming the nozzles; and confirming that all nozzles are firing the same way as before the jetting was stopped.

Tables 1-3 show ink compositions denoted OctaM-1, OctaM-2 and OctaM-3, comprising the monomethacrylate monomer n-octadecyl methacrylate (OctaM). Each of these ink compositions had latency times of at least 15 minutes and had droplet spreading properties and print edges suitable for use in printing polymeric thin film encapsulating layers for OLED devices. Although these and the other ink compositions discussed below provided linear print edges as-printed, ink compositions that provide non-linear print edges can be used, provided a subsequent processing step, such as laser cutting, is used to correct the non-linearity after the printed ink has cured.

TABLE 1

| Formulation 1 | | |
|---|---|---|
| Component | Wt. % | Wt. (g) |
| OctaM | 30 | 3.00 |
| SR9209A | 4.0 | 0.400 |
| PEG-200D | 55 | 5.50 |
| PET | 7.0 | 0.700 |
| BASF-TPO | 4.0 | 0.400 |
| Total | 100 | 10.0 |

Formulation 1 had a viscosity of 17.2 cps at 20.3° C. and a surface tension of 34.2 dynes/cm at 20.3° C.

TABLE 2

| Formulation 2 | | |
|---|---|---|
| Component | Wt. % | Wt. (g) |
| OctaM | 30 | 3.00 |
| SR9209A | 5.0 | 0.500 |
| PEG-200D | 50 | 5.00 |
| PET | 11 | 1.10 |
| BASF-TPO | 4.0 | 0.400 |
| Total | 100 | 10.0 |

Formulation 2 had a viscosity of 18.6 cps at 18.8° C. and a surface tension of 34.3 dynes/cm at 18.8° C.

TABLE 3

| Formulation 3 | | |
|---|---|---|
| Component | Wt. % | Wt. (g) |
| OctaM | 34 | 3.40 |
| SR9209A | 5.0 | 0.500 |
| PEG-200D | 50 | 5.00 |
| PET | 7.0 | 0.700 |
| BASF-TPO | 4.0 | 0.400 |
| Total | 100 | 10.0 |

Formulation 3 had a viscosity of 17.2 cps at 18.5° C. and a surface tension of 34.3 dynes/cm at 18.5° C.

The droplet spreading and print edge quality, respectively, for Formulation 3 are shown in the images of FIG. 11 and FIG. 12. FIG. 11A shows droplets of the ink composition 40 seconds after printing and FIG. 11C shows the same droplets 15 minutes later. FIGS. 11B and 11D are line drawings reproducing the images of FIGS. 11A and 11C, respectively.) The approximate diameters of the droplets in FIGS. 11A and 11B are 160 µm and 220 µm, respectively. FIG. 12A shows the print edge 40 seconds after printing and FIG. 12C shows the same print edge 10 minutes after printing. (FIGS. 12B and 12D are line drawings reproducing the images of FIGS. 12A and 12C, respectively.) To assess spreading behavior, droplets of the ink composition are printed along the X, Y coordinates and their dimensions are observed and/or imaged over time. To assess print edge quality and spread, continuous square films of the ink compositions are printed and observed and/or imaged over time.

Tables 4 and 5 show ink compositions denoted Formulation 4 and Formulation 5, comprising the monoacrylate monomer DCPOEA. Both of these ink compositions had latency times of at least 15 minutes and had droplet spreading properties and print edges suitable for use in printing polymeric thin film encapsulating layers for OLED devices.

TABLE 4

| Formulation 4 | | |
|---|---|---|
| Component | Wt. % | Wt. (g) |
| DCPOEA | 30 | 3.00 |
| SR9209A | 4.0 | 0.400 |
| PEG-200D | 55 | 5.50 |
| PET | 7.0 | 0.700 |
| BASF-TPO | 4.0 | 0.400 |
| Total | 100 | 10.0 |

Formulation 4 had a viscosity of 20.1 cps at 22.4° C. and a surface tension of 39.2 dynes/cm at 22.4° C.

TABLE 5

| Formulation 5 | | |
|---|---|---|
| Component | Wt. % | Wt. (g) |
| DCPOEA | 30 | 3.00 |
| SR9209A | 9.0 | 0.900 |
| PEG-200D | 50 | 5.00 |
| PET | 7.0 | 0.700 |
| BASF-TPO | 4.0 | 0.400 |
| Total | 100 | 10.0 |

Formulation 5 had a viscosity of 18.5 cps at 23.6° C. and a surface tension of 39.3 dynes/cm at 23.6° C.

The droplet spreading and print edge quality, respectively, for Formulation 5 are shown in the images of FIG. 13 and FIG. 14. FIG. 13A shows droplets of the ink composition three minutes after printing and FIG. 13C shows the same droplets 10 minutes after printing. (FIGS. 13B and 13D are line drawings reproducing the images of FIGS. 13A and 13C, respectively.) The diameters for the droplets in FIGS. 13A and 13C are in the range from about 90 μm to about 100 μm, illustrating that the droplet diameters remain substantially unchanged ten minutes after printing. FIG. 14A shows the print edge three minutes after printing and FIG. 14C shows the same print edge 10 minutes after printing. (FIGS. 14B and 14D are line drawings reproducing the images of FIGS. 14A and 14C, respectively.) As shown in FIG. 13, the DCPOEA-based ink compositions can be used for applications where it is desirable to have little droplet spreading.

Tables 6 and 7 show ink compositions denoted Formulation 6 and Formulation 7. These ink compositions comprise a mixture of DCPOEA and ISOBA monomers. The ISOBA monomers are used to increase the spreading of the printed ink droplets by about 15%, relative to ink compositions comprising DCPOEA as the sole mono(meth)acrylate monomer. These ink compositions had latency times of at least 15 minutes and had droplet spreading properties and print edges suitable for use in printing polymeric thin film encapsulating layers for OLED devices.

TABLE 6

| Formulation 6 | | |
|---|---|---|
| Component | Wt. % | Wt. (g) |
| DCPOEA | 13 | 2.60 |
| ISOBA | 15 | 3.00 |
| SR9209A | 4.0 | 0.800 |
| PEG-200D | 57 | 11.4 |
| PET | 7.0 | 1.40 |
| BASF-TPO | 4.0 | 0.800 |
| Total | 100 | 20.0 |

Formulation 6 had a viscosity of 17.6 cps at 22.8° C. and a surface tension of 37.5 dynes/cm at 22.8° C.

TABLE 7

| Formulation 7 | | |
|---|---|---|
| Component | Wt. % | Wt. (g) |
| DCPOEA | 25 | 2.50 |
| ISOBA | 5.0 | 0.500 |
| SR9209A | 4.0 | 0.400 |
| PEG-200D | 55 | 5.50 |
| PET | 7.0 | 0.700 |
| BASF-TPO | 4.0 | 0.400 |
| Total | 100 | 10.0 |

Formulation 7 had a viscosity of 16.1 cps at 27.7° C. and a surface tension of 38.1 dynes/cm at 27.7° C.

The print edge quality for the ink composition Formulation 6 is shown in the images of FIG. 15. FIG. 15A shows the print edge two minutes after printing and FIG. 15C shows the same print edge three minutes after printing. (FIGS. 15B and 15D are line drawings reproducing the images of FIGS. 15A and 15C, respectively.)

The droplet spreading and print edge quality, respectively, for Formulation 7 are shown in the images of FIG. 19 and FIG. 20. FIG. 19A shows droplets of the ink composition 30 seconds after printing and FIG. 19B shows the same droplets 10 minutes after printing. FIG. 20A shows the print edge one minute after printing and FIG. 20B shows the same print edge 10 minutes after printing. (FIGS. 19B and 19D are line drawings reproducing the images of FIGS. 19A and 19C, respectively. FIGS. 20B and 20D are line drawings reproducing the images of FIGS. 20A and 20C, respectively.)

Figure 16:
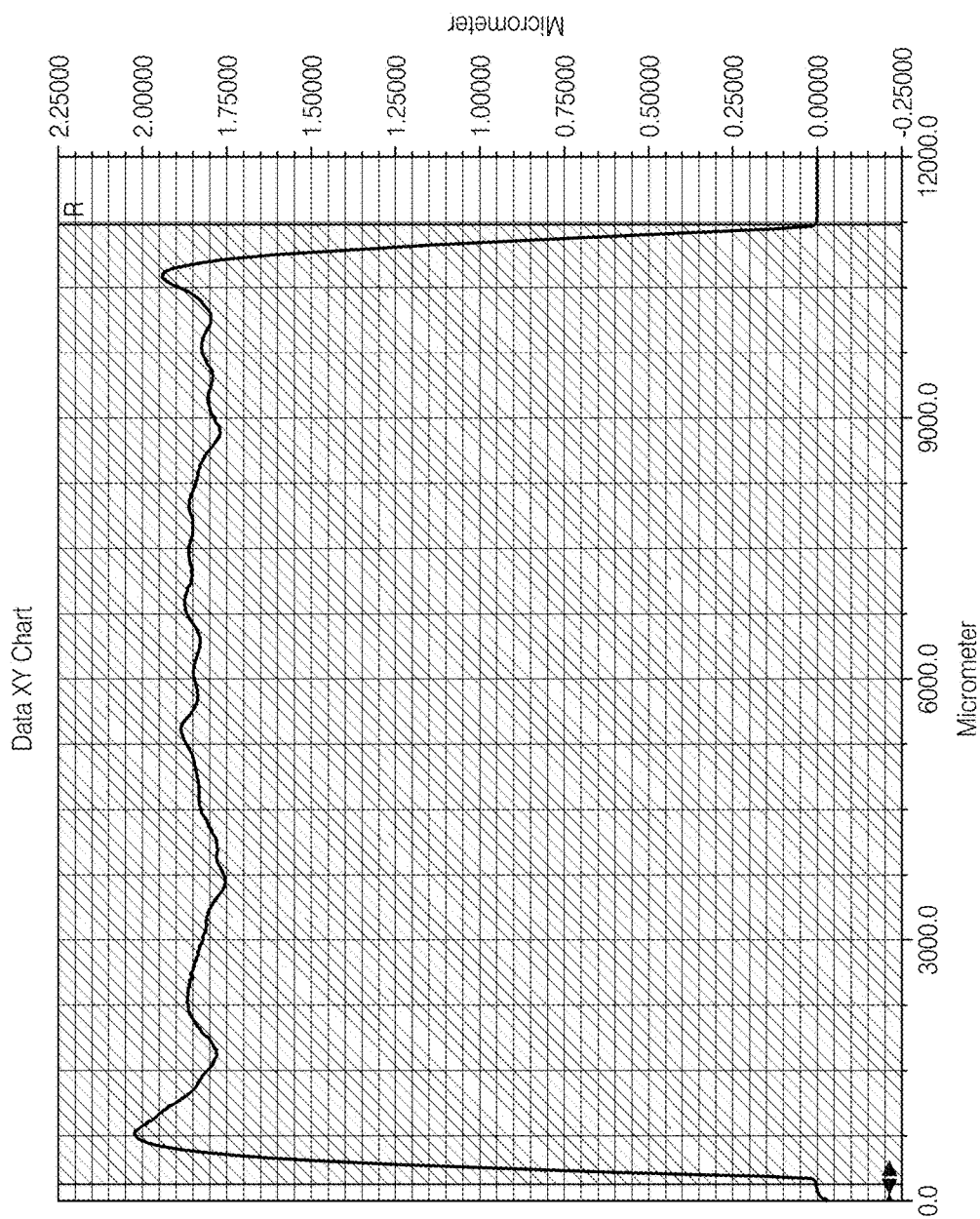
FIG. 16 is a profilometry graph showing the surface profile of a 2 μm film printed using an ink composition comprising n-octadecyl methacrylate monomers.
Figure 17:
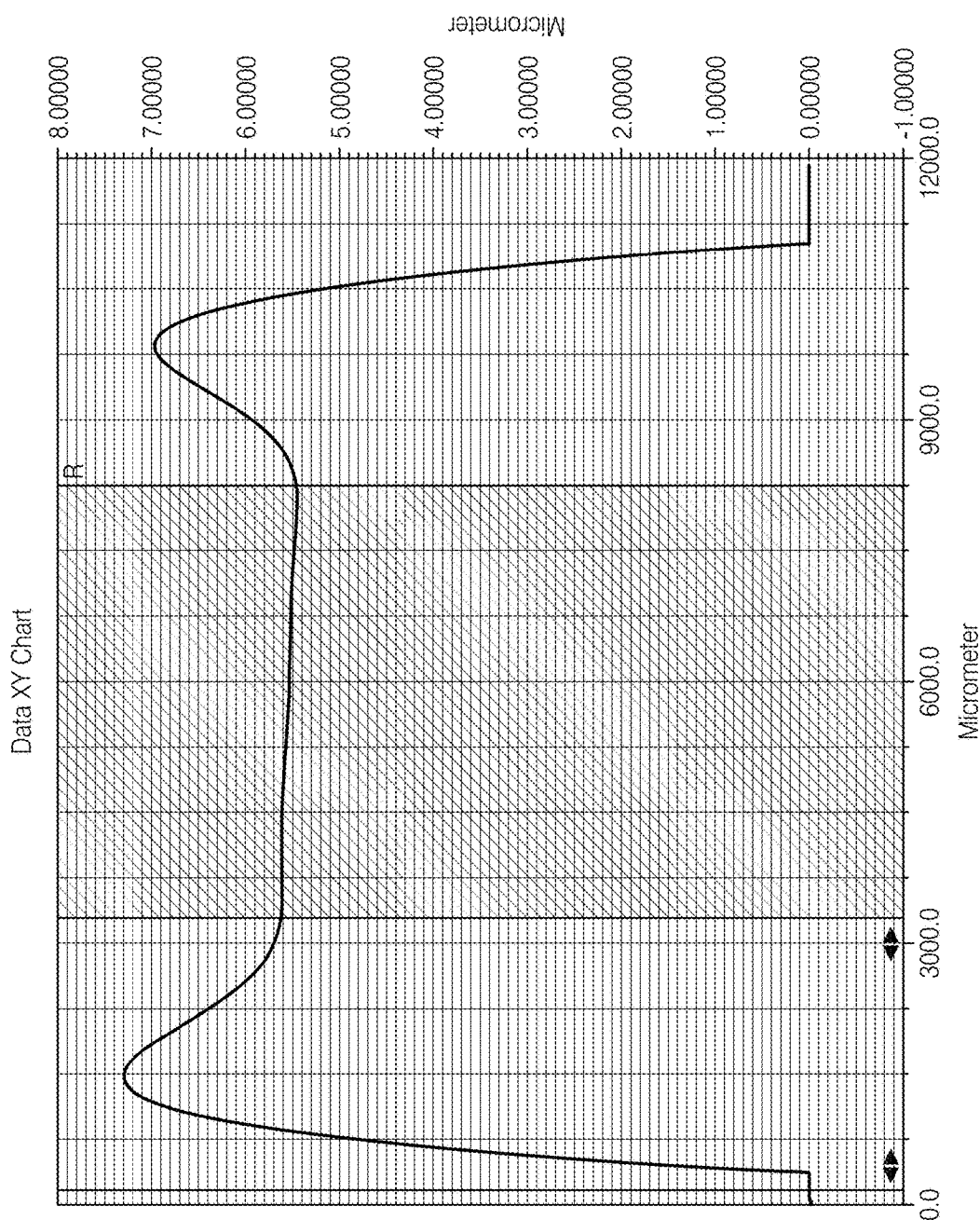
FIG. 17 is a profilometry graph showing the surface profile of a 6 μm film printed using an ink composition comprising dicyclopentenyloxyethyl acrylate monomers.
Figure 18:
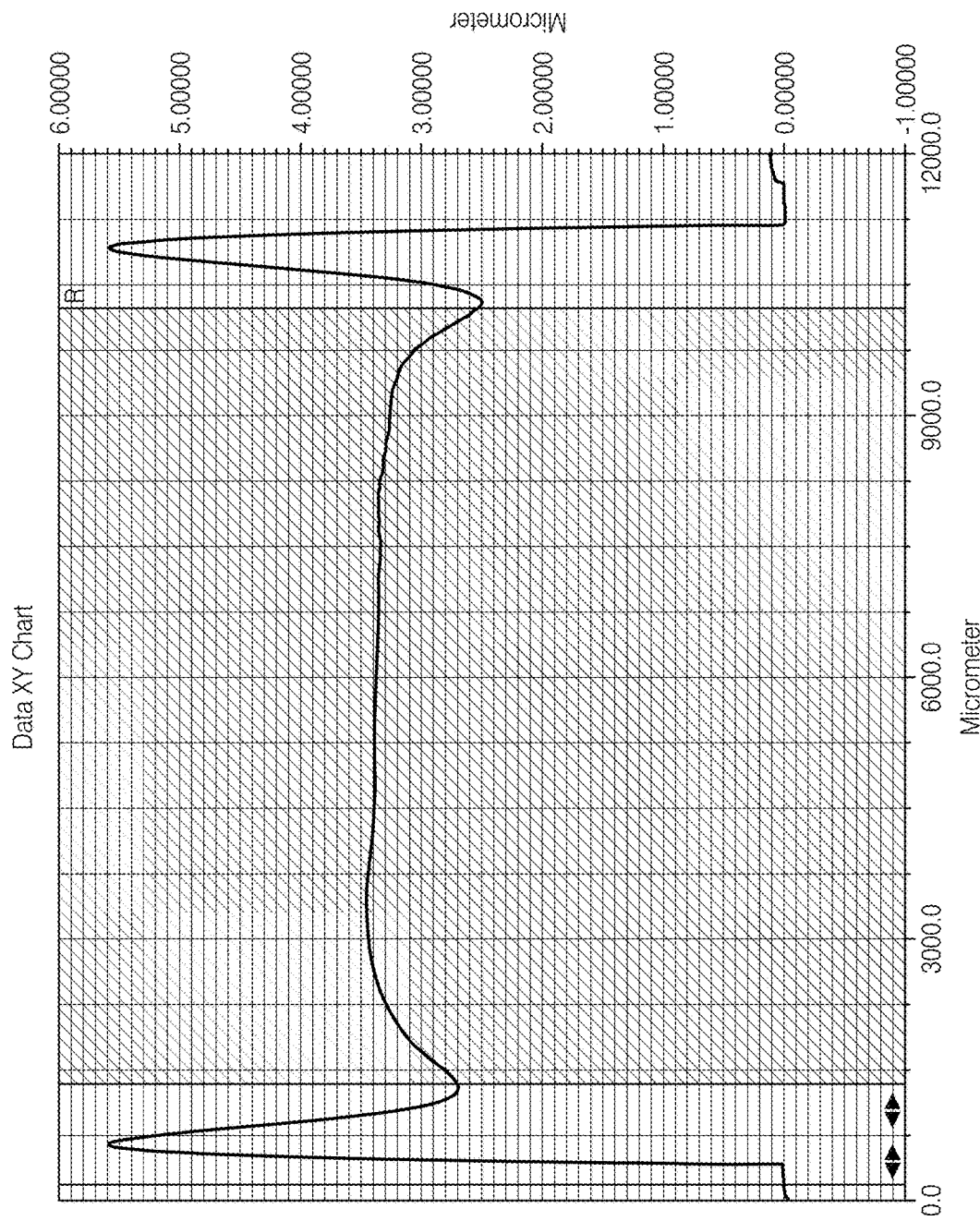
FIG. 18 is a profilometry graph showing the surface profile of a 4 μm film printed using an ink composition comprising a mixture of dicyclopentenyloxyethyl acrylate and isobornyl acrylate monomers.
Figure 19B:
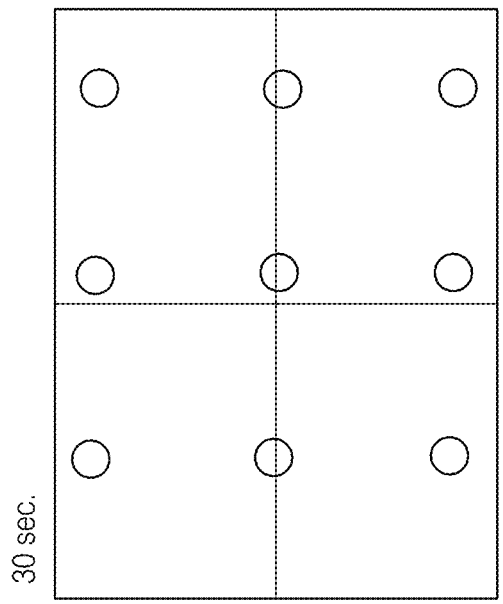
FIG. 19B is a line drawing representing FIG. 19A.
Figure 19A:
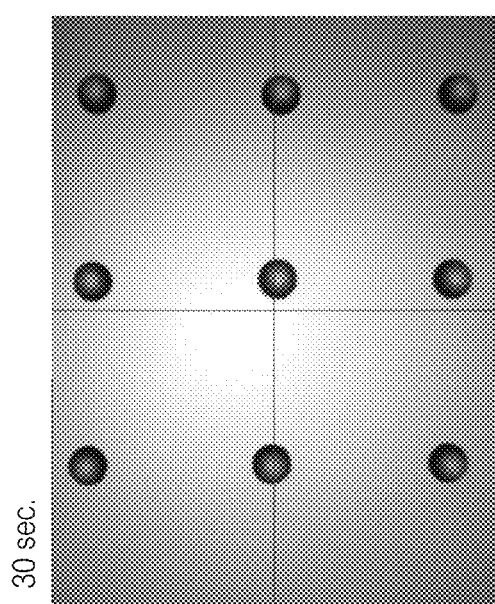
FIG. 19A is an image of droplets of ink composition Formulation 7 30 seconds after printing.
Figure 19D:
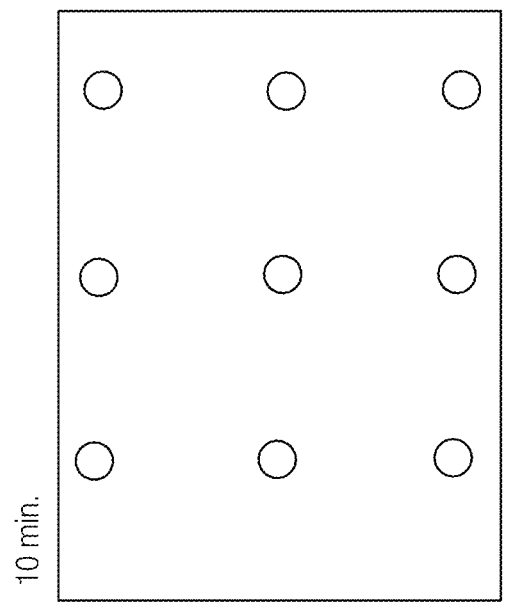
FIG. 19D is a line drawing representing FIG. 19C.
Figure 19C:
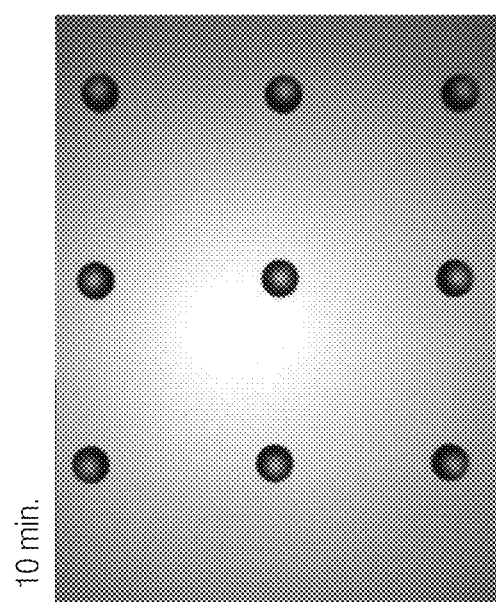
FIG. 19C shows the droplets of FIG. 19A 10 minutes after printing.
Figure 20B:
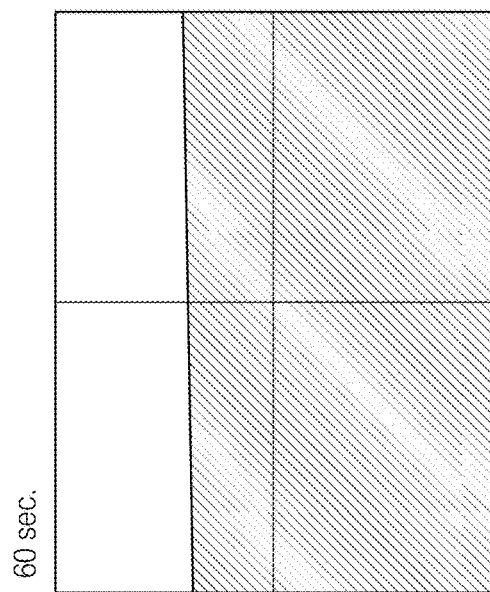
FIG. 20B is a line drawing representing FIG. 20A.
Figure 20A:
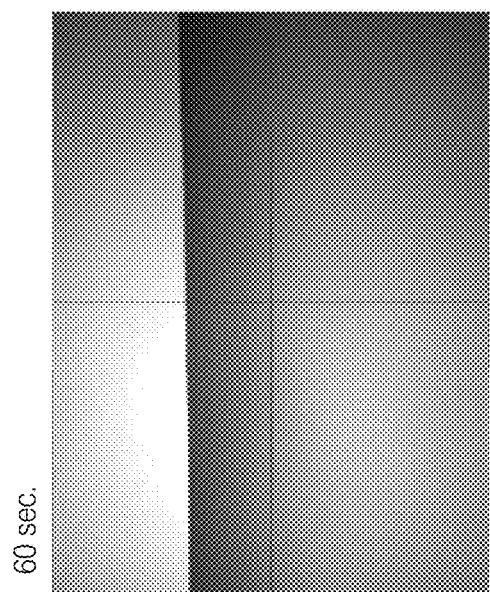
FIG. 20A is an image of the print edge for ink composition Formulation 7 60 seconds after printing.
Figure 20D:
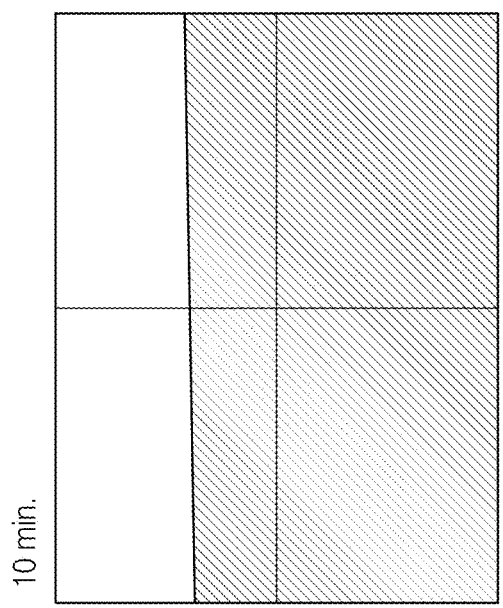
FIG. 20D is a line drawing representing FIG. 20C.
Figure 20C:
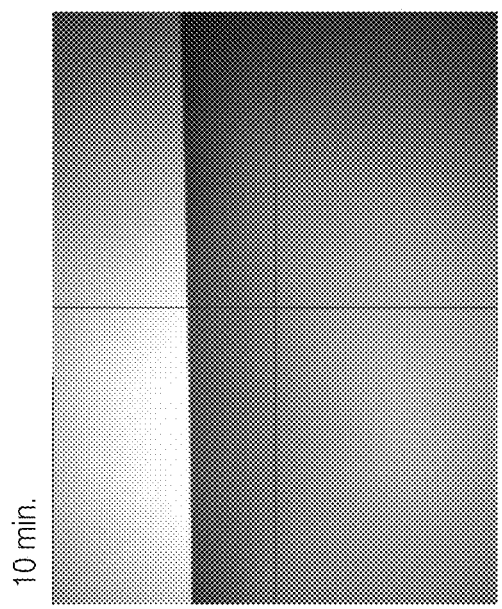
FIG. 20C shows the print edge of FIG. 20A 10 minutes after printing.

After curing, the continuity of films having an area of one cm$^2$ that were inkjet printed onto the surface of silicon wafers using Formulations 3, 5, and 7 was observed visually and their thicknesses measured via profilometry. Continuous films having thicknesses of 2 μm, 4 μm, 6 μm, and 8 μm were successfully printed using Formulation 3; continuous films having thicknesses of 6 μm and 8 μm were successfully printed using Formulation 5; and continuous films having thicknesses of 4 μm, 6 μm, and 8 μm were successfully printed using Formulation 7. Surface profilometry graphs of a 2 μm film printed using Formulation 3; a 6 μm film printed using Formulation 5; and a 4 μm film printed using Formulation 7 are shown in FIG. 16, FIG. 17, and FIG. 18, respectively. The film thicknesses cited herein refer to the average thickness of the cured films measured from edge-to-edge assuming edge compensation had been applied—that is, without the sharp thickness variation at the outermost edges shown in profilometry graphs of FIGS. 16, 17, and 18.

Systems and Methods for Organic Thin Film Formation on a Substrate

As previously discussed herein, manufacture of various OLED devices on a variety of substrates can be done in an inert, substantially particle-free environment to ensure high-yield manufacturing.

For clearer perspective regarding substrate sizes that can be used in manufacturing of various OLED devises, generations of mother glass substrate sizes have been undergoing evolution for flat panel displays fabricated by other-than OLED printing since about the early 1990's. The first generation of mother glass substrates, designated as Gen 1, is approximately 30 cm×40 cm, and therefore could produce a 15" panel. Around the mid-1990's, the existing technology for producing flat panel displays had evolved to a mother glass substrate size of Gen 3.5, which has dimensions of about 60 cm×72 cm. In comparison, a Gen 5.5 substrate has dimensions of about 130 cm×150 cm.

As generations have advanced, mother glass sizes for Gen 7.5 and Gen 8.5 are in production for other-than OLED printing fabrication processes. A Gen 7.5 mother glass has dimensions of about 195 cm×225 cm, and can be cut into eight 42" or six 47" flat panels per substrate. The mother glass used in Gen 8.5 is approximately 220×250 cm, and can be cut to six 55" or eight 46" flat panels per substrate. The promise of OLED flat panel display for qualities such as truer color, higher contrast, thinness, flexibility, transparency, and energy efficiency have been realized, at the same time that OLED manufacturing is practically limited to G 3.5 and smaller. Currently, OLED printing is believed to be the optimal manufacturing technology to break this limitation and enable OLED panel manufacturing for not only mother glass sizes of Gen 3.5 and smaller, but at the largest mother glass sizes, such as Gen 5.5, Gen 7.5, and Gen 8.5. One of the features of OLED panel display technology includes that a variety of substrate materials can be used, for example, but not limited by, a variety of glass substrate materials, as well as a variety of polymeric substrate materials. In that regard, sizes recited from the terminology arising from the use of glass-based substrates can be applied to substrates of any material suitable for use in OLED printing.

Table 8 below relates generation substrate designation to sizes as often can be found in various sources relating to generation substrates for various OLED devices. Table 9 below summarizes aspect ratios and areas for some known generation-sized substrates as currently available in various sources relating to generation-sized substrates. It should be understood that variation of aspect ratio and hence size may be seen from manufacturer to manufacturer. Additionally, It should be the information provided in Table 9 can be subject to change, given the evolution of the industry. In that regard, updated conversion factors for a specific generation-sized substrate, as well as area in square meters can be obtained any of a variety of generation-sized substrates.

TABLE 8

Correlation between area and substrate size

| Generation ID | X (mm) | Y (mm) | Area (m²) |
|---|---|---|---|
| Gen 3.0 | 550 | 650 | 0.36 |
| Gen 3.5 | 610 | 720 | 0.44 |
| Gen 3.5 | 620 | 750 | 0.47 |
| Gen 4 | 680 | 880 | 0.60 |
| Gen 4 | 730 | 920 | 0.67 |
| Gen 5 | 1100 | 1250 | 1.38 |

TABLE 8-continued

Correlation between area and substrate size

| Generation ID | X (mm) | Y (mm) | Area (m²) |
|---|---|---|---|
| Gen 5 | 1100 | 1300 | 1.43 |
| Gen 5.5 | 1300 | 1500 | 1.95 |
| Gen 6 | 1500 | 1850 | 2.78 |
| Gen 7.5 | 1950 | 2250 | 4.39 |
| Gen 8 | 2160 | 2400 | 5.18 |
| Gen 8 | 2160 | 2460 | 5.31 |
| Gen 8.5 | 2200 | 2500 | 5.50 |
| Gen 9 | 2400 | 2800 | 6.72 |
| Gen 10 | 2850 | 3050 | 8.69 |

Manufacturing tools that in principle can allow for the printing of a variety of substrate sizes that includes large-format substrate sizes, can require substantially large facilities for housing such OLED manufacturing tools. Accordingly, maintaining an entire large facility under an inert atmosphere presents engineering challenges, such as continual purification of a large volume of an inert gas. Various embodiments of a gas enclosure system can have a circulation and filtration system internal a gas enclosure assembly in conjunction with a gas purification system external a gas enclosure that together can provide continuous circulation of a substantially low-particulate inert gas having substantially low levels of reactive species throughout a gas enclosure system. According to the present teachings, an inert gas may be any gas that does not adversely alter a product being fabricated under a defined set of conditions. Some commonly used non-limiting examples of an inert gas for the processing of various embodiments of an OLED device can include nitrogen, any of the noble gases, and any combination thereof. Systems and methods of the present teachings can provide a large facility that is essentially hermetically sealed to prevent contamination of various reactive atmospheric gases, such as water vapor and oxygen, as well as organic solvent vapors generated from various printing processes. According to the present teachings, an OLED printing facility would maintain levels for each species of various reactive species, including various reactive atmospheric gases, such as water vapor and oxygen, as well as organic solvent vapors at 100 ppm or lower, for example, at 10 ppm or lower, at 1.0 ppm or lower, or at 0.1 ppm or lower.

The need for printing an OLED panel in a facility in which the levels of each of a reactive species should be maintained at targeted low levels can be illustrated in reviewing the information summarized in Table 9. The data summarized on Table 9 resulted from the testing of each of a test coupon comprising organic thin film compositions for each of red, green, and blue, fabricated in a large-pixel, spin-coated device format. Such test coupons are substantially easier to fabricate and test for the purpose of rapid evaluation of various formulations and processes. Though test coupon testing should not be confused with lifetime testing of a printed panel, it can be indicative of the impact of various formulations and processes on lifetime. The results shown in the table below represent variation in the process step in the fabrication of test coupons in which only the spin-coating environment varied for test coupons fabricated in a nitrogen environment where reactive species were less than 1 ppm compared to test coupons similarly fabricated but in air instead of a nitrogen environment.

It is evident through the inspection of the data in Table 9, shown below, for test coupons fabricated under different processing environments, particularly in the case of red and blue, that printing in an environment that effectively reduces exposure of organic thin film compositions to reactive species may have a substantial impact on the stability of various ELs, and hence on lifetime. The lifetime specification is of particular significance for OLED panel technology, as this correlates directly to display product longevity; a product specification for all panel technologies, which has been challenging for OLED panel technology to meet. In order to provide panels meeting requisite lifetime specifications, levels of each of a reactive species, such as water vapor, oxygen, as well as organic solvent vapors, can be maintained at 100 ppm or lower, for example, at 10 ppm or lower, at 1.0 ppm or lower, or at 0.1 ppm or lower with various embodiments of a gas enclosure system of the present teachings.

TABLE 9

Impact of inert gas processing on lifetime for OLED panels

| Color | Process Environment | V @ 10 mA/cm$^2$ | Cd/A | CIE (x, y) | T95 | T80 | T50 |
|---|---|---|---|---|---|---|---|
| | | | | @ 1000 Cd/m$^2$ | | | |
| Red | Nitrogen | 6 | 9 | (0.61, 0.38) | 200 | 1750 | 10400 |
| | Air | 6 | 8 | (0.60, 0.39) | 30 | 700 | 5600 |
| Green | Nitrogen | 7 | 66 | (0.32, 0.63) | 250 | 3700 | 32000 |
| | Air | 7 | 61 | (0.32, 0.62) | 250 | 2450 | 19700 |
| Blue | Nitrogen | 4 | 5 | (0.14, 0.10) | 150 | 750 | 3200 |
| | Air | 4 | 5 | (0.14, 0.10) | 15 | 250 | 1800 |

In addition to providing an inert environment, maintaining a substantially low-particle environment for OLED printing is of particular importance, as even very small particles can lead to a visible defect on an OLED panel. Particle control in a gas enclosure system can present significant challenges not presented for processes that can be done, for example, in atmospheric conditions under open air, high flow laminar flow filtration hoods.

For example, of a manufacturing facility can require a substantial length of various service bundles that can be operatively connected from various systems and assemblies to provide optical, electrical, mechanical, and fluidic connections required to operate, for example, but not limited by, a printing system. Such service bundles used in the operation of a printing system and located proximal to a substrate positioned for printing can be an ongoing source of particulate matter. Additionally, components used in a printing system, such as fans or linear motion systems that use friction bearing, can be particle generating components. Various embodiments of a gas circulation and filtration system of the present teachings can be used in conjunction with particle control components to contain and exhaust particulate matter. Additionally, by using a variety of intrinsically low-particle generating pneumatically operated components, such as, but not limited by, substrate floatation tables, air bearings, and pneumatically operated robots, and the like, a low particle environment for various embodiments of a gas enclosure system can be maintained. Regarding maintaining a substantially low-particle environment, various embodiments of a gas circulation and filtration system can be designed to provide a low particle inert gas environment for airborne particulates meeting the standards of International Standards Organization Standard (ISO) 14644-1:1999, "Cleanrooms and associated controlled environments—Part 1: Classification of air cleanliness," as specified by Class 1 through Class 5

Figure 3:
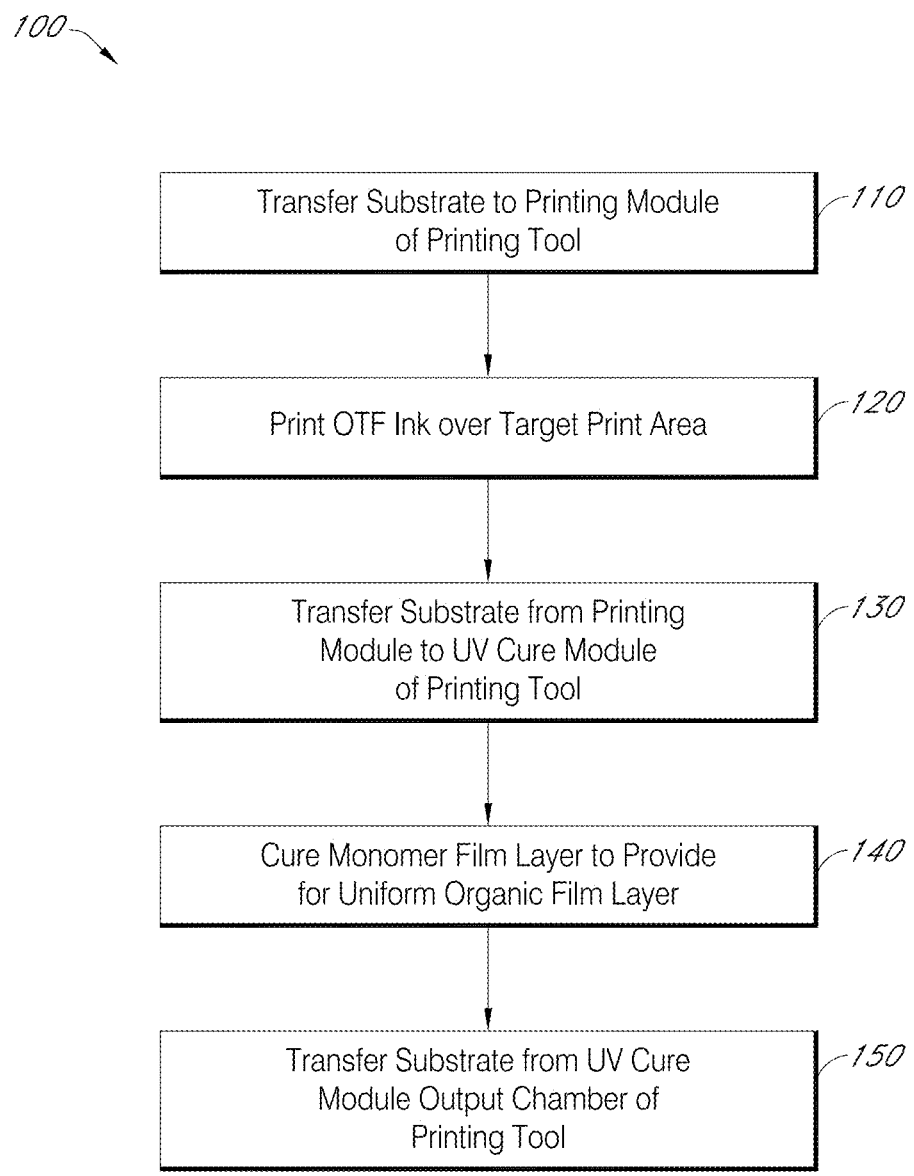
FIG. 3 is a flow diagram depicting a process for forming a polymeric thin film on a substrate, according to various embodiments of compositions, systems and methods of the present teachings.

As depicted in FIG. 3, process 100 for printing an organic thin film ink on a substrate and then curing the ink can include step 110 of transferring a substrate from a manufacturing tool in which, for example, an inorganic encapsulation layer was fabricated on an OLED substrate device using a vapor deposition process. As will be discussed in more detail subsequently herein, a substrate can be transferred from an inorganic encapsulation fabrication tool to a printing module of a printing tool There can be many advantages of inkjet printing for a variety of processes that can utilize pattered area printing. First, a range of vacuum processing operations can be eliminated because such inkjet-based fabrication can be performed at atmospheric pressure. Additionally, during an inkjet printing process, an organic encapsulation layer can be localized to cover portions of an OLED substrate over and proximal to an active region, to effectively encapsulate an active region, including lateral edges of the active region. The targeted patterning using inkjet printing results in eliminating material waste, as well as eliminating additional processing typically required to achieve patterning of an organic layer, which can result in enhanced particle contamination. For example, masking is a well-known technique used for patterned film deposition, however, masking techniques can create substantial particle contamination.

In step 120, using various embodiments of organic thin layer inks according to the present teachings, a printing tool can be used to print an organic thin film layer over a target print area. In the art of processing, total average cycle time or TACT can be an expression of a unit of time for a particular process cycle. For various embodiments of systems and methods of the present teachings, for a step of printing an organic thin film ink, TACT can be between about 30 seconds to about 120 seconds. Subsequently, as indicated by step 130, the substrate can be transferred from a printing module of a printing tool to a curing module. With respect to a step of curing, as indicated by step 140, according to various embodiments of systems and methods of the present teachings, before curing is initiated, a step of allowing the printed organic thin film ink to reach a film layer of uniform thickness can be done. In various embodiments, such a leveling step can be considered a separate step. In various embodiments of systems and methods, leveling can be done in a dedicated chamber, for example, in a holding chamber, and then a substrate can be transferred to a curing chamber. For various embodiments of the present teachings, as will be discussed in more detail herein, a step of leveling can be done in the same chamber as the step of curing. According to various embodiments of systems and methods of the present teachings, TACT for a step of leveling can be between about 170 seconds to about 210 seconds, while TACT for a curing step according to some embodiments can be between about 15 seconds to 60 seconds, while for other embodiments can be between about 25 seconds to about 35 seconds. After curing step 140, a substrate can be transferred from a UV curing module to another processing chamber, such as an output loadlock chamber, as indicated by process step 150 of process 100.

Figure 4:
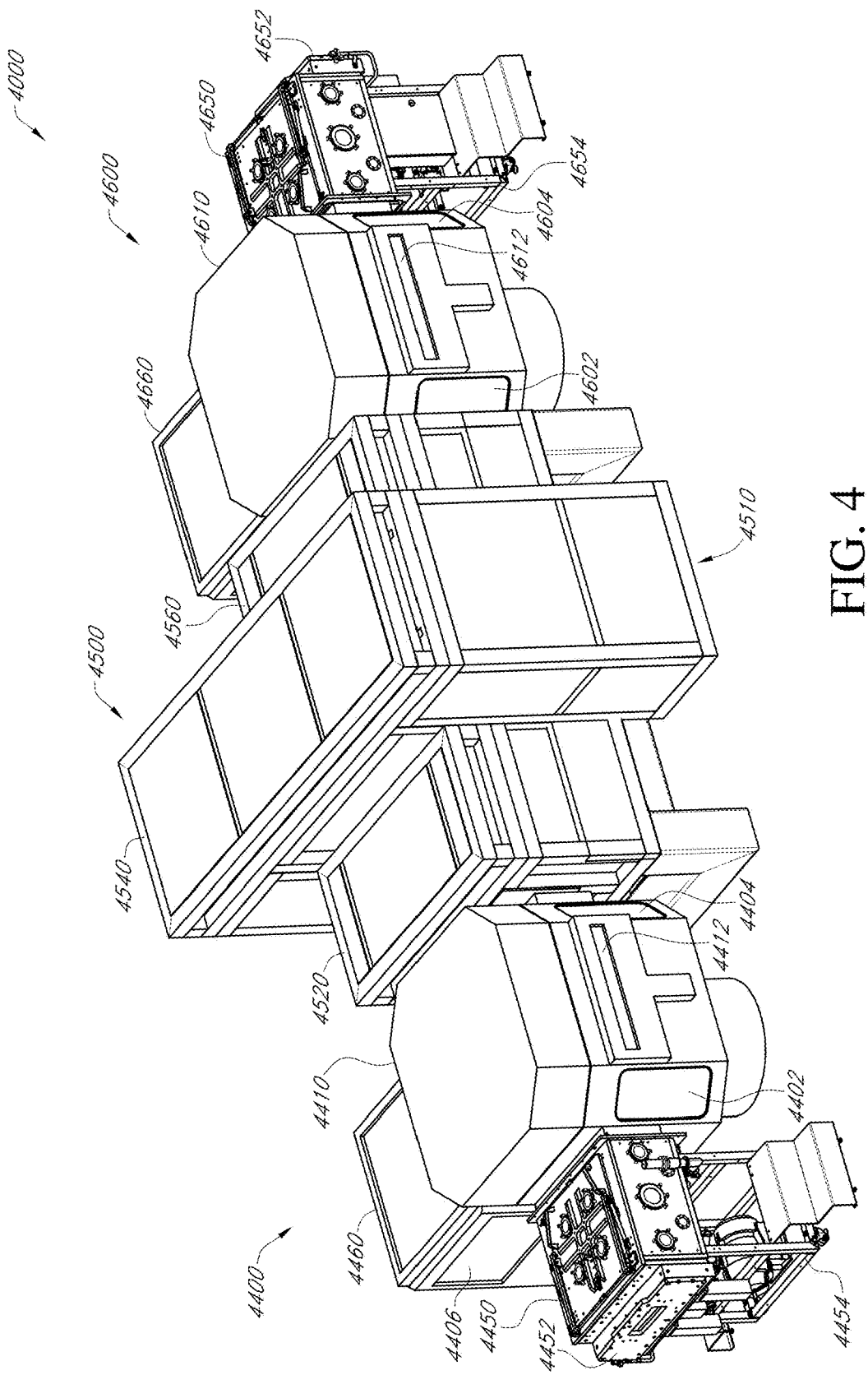
FIG. 4 is a front perspective view of view of a printing system tool in accordance with various embodiments of the present teachings.

In order to accomplish process 100 of FIG. 3, various embodiments of manufacturing tools of the present teachings that can provide inert, substantially particle-free environments can be used, for example, as shown in FIG. 4. FIG. 4 depicts a perspective view of OLED printing tool 4000 according to various embodiments of the present teachings, which can include first module 4400, printing module 4500, and second module 4600. Various modules, such as first module 4400 can have first transfer chamber 4410, which can have a gate, such as gate 4412, for each side of first transfer chamber 4410 to accommodate various chambers having a specified function. As depicted in FIG. 4 first transfer chamber 4410 can have a load lock gate (not shown) for integration of first load lock chamber 4450 with first transfer chamber 4410, as well as a buffer gate (not shown) for integration of first buffer chamber 4460 with first transfer chamber 4410. Gate 4412 of first transfer chamber 4410 can be used for a chamber or unit that can be movable, such as, but not limited by, a load lock chamber. Observation windows, such as observation windows 4402 and 4404 of first transfer chamber 4410, as well as observation window 4406 of first buffer chamber 4460, can be provided for an end user to, for example, monitor a process. Printing module 4500 can include gas enclosure 4510, which can have first panel assembly 4520, printing system enclosure assembly 4540, and second panel assembly 4560. Gas enclosure 4510 can house various embodiments of a printing system.

Various embodiments of a gas enclosure can be contoured around a printing system base, upon which a substrate support apparatus can be mounted. Further, a gas enclosure can be contoured around a bridge structure used for the X-axis movement of a carriage assembly. As a non-limiting example, various embodiments of a contoured gas enclosure according to the present teachings can have a gas enclosure volume of between about 6 $m^3$ to about 95 $m^3$ for housing various embodiments of a printing system capable of printing substrate sizes from Gen 3.5 to Gen 10. By way a further non-limiting example, various embodiments of a contoured gas enclosure according to the present teachings can have a gas enclosure volume of between about 15 $m^3$ to about 30 $m^3$ for housing various embodiments of a printing system capable of printing, for example, Gen 5.5 to Gen 8.5 substrate sizes. Such embodiments of a contoured gas enclosure can be between about 30% to about 70% savings in volume in comparison to a non-contoured enclosure having non-contoured dimensions for width, length and height.

Second module 4600 of FIG. 4 can include second transfer chamber 4610, which can have a gate, such as gate 4612, for each side of second transfer chamber 4610 to accommodate various chambers having a specified function. As depicted in FIG. 4 second transfer chamber 4610 can have a load lock gate (not shown) for integration of second load lock chamber 4650 with second transfer chamber 4610, as well as a gate (not shown) for integration of second chamber 4660 with second transfer chamber 4610. Gate 4612 of second transfer chamber 4610 can be used for a chamber or unit that can be movable, such as, but not limited by, a load lock chamber. Observation windows, such as observation windows 4602 and 4604 of second transfer chamber 4610, can be provided for an end user to, for example, monitor a process. According to various embodiments of systems and methods of the present teachings, chamber 4660 of FIG. 4 can be a UV curing module. For example, chamber 4660 of FIG. 4 can be a UV curing module as depicted in FIG. 5.

First load lock chamber 4450 and second load lock chamber 4650 can be affixably associated with first transfer chamber 4410 and second transfer chamber 4610, respectively or can be movable, such as on wheels or on a track assembly, so that they can be readily positioned for use proximal a chamber. According to the present teachings, a load lock chamber can be mounted to a support structure and can have at least two gates. For example first load lock chamber 4450 can be supported by first support structure 4454 and can have first gate 4452, as well as a second gate (not shown) that can allow fluid communication with first transfer module 4410. Similarly, second load lock chamber 4650 can be supported by second support structure 4654 and can have second gate 4652, as well as a first gate (not shown) that can allow fluid communication with second transfer module 4610.

Figure 5:
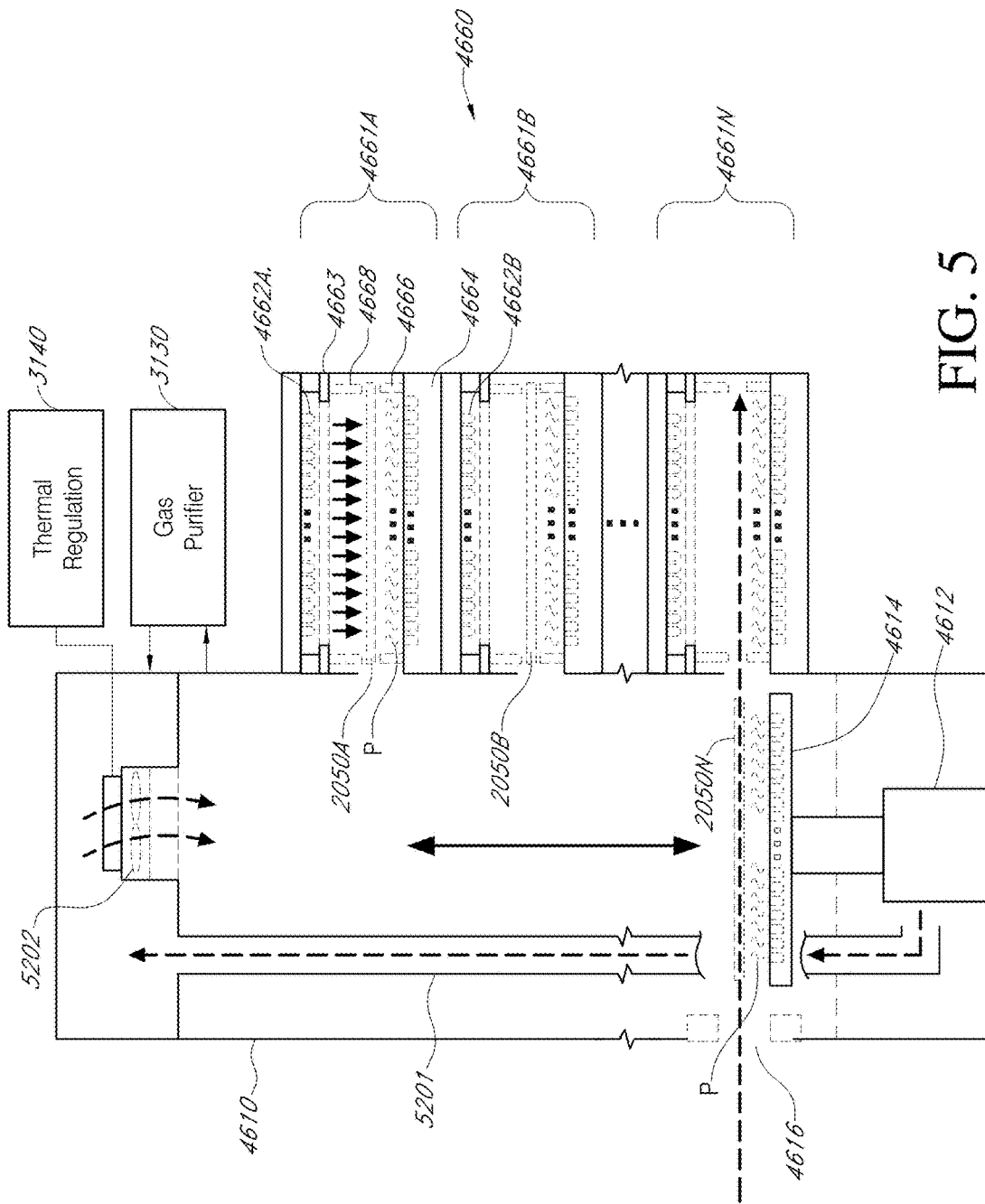
FIG. 5 is a schematic depiction of a UV curing module that can be used in manufacturing a light emitting device.

FIG. 5 illustrates generally an example an ultraviolet (UV curing) module that can be used in manufacturing a light emitting device. The treatment system can be included as a portion of other systems or techniques described herein. For example, as indicated in FIG. 5, UV curing module 4660 could be chamber 4660 of OLED printing tool 4000 of FIG. 4. The system can include various regions, such as for use as a curing chamber, or for use as a combination curing and holding chamber. For various embodiments of a curing chamber, a source of ultraviolet emission can be used such as to treat one or more layers deposited on a substrate being fabricated. For example, ultraviolet emission can be used to polymerize or otherwise treat an organic layer deposited on the substrate, such as for use in one or more processes related to manufacturing a flat panel display assembly, such as including an OLED display assembly.

According to the present teachings, a UV curing module can include one or more enclosed UV curing chambers such as first UV curing chamber 4661A, second UV curing chamber 4661B, and "Nth" UV curing chamber 4661N. For example, three regions can be included and in another example, other numbers of regions can be included. The regions can be oriented in a "stacked" configuration along a vertical axis of the system, such as shown illustratively in FIG. 5. Other configurations can be used, such as a radial configuration of chambers extending outward from a central chamber. For example, transfer chamber 4610 of FIG. 5 can be second transfer chamber 4610 of FIG. 4.

In an illustrative example, such as after deposition of an organic layer on a substrate, a leveling operation can be performed. As was previously discussed herein, a duration of a leveling operation can generally be greater than a duration of an ultraviolet treatment operation. Accordingly, in one approach, respective holding regions or "buffer cells" can be used, such as in a stacked configuration with each region configured to house a substrate. In this approach, the leveling operation can proceed without restricting access or otherwise tying up a separate ultraviolet treatment region. However, multiple ultraviolet sources can be used, such including user lower-cost sources. In this manner, a throughput impact of idling an ultraviolet source need not preclude use of the same UV curing chamber (e.g., 4661A through 4661N) for both a holding operation (e.g., buffering or leveling), as well as for an ultraviolet treatment operation, because multiple regions can be configured to provide ultraviolet treatment. Such an approach can also provide redundancy of the ultraviolet sources such that processing can continue even if a particular ultraviolet source fails or is undergoing maintenance.

For example, first radiation source 4662A (e.g., an ultraviolet-emitting LED array) can provide ultraviolet emission, depicted as multiple arrows in FIG. 5. A UV apparatus can include a UV single source, a liner array, or a two dimensional array of UV source. The type of source selected can have a specified range of wavelengths to a first substrate 2050A. As depicted in FIG. 5, a first set of radiation sources 4662A are depicted. Though the term "UV" is used, it is to be understood that the source has a wavelength of light associated with an energy required to initiate a polymerization reaction. In that regard, as free-radical initiation can occur via thermal decomposition as well as photolysis, a source of radiation can include any source effective in initiating a polymerization reaction through a variety of mechanism. The electromagnetic radiation emission can be coupled to an interior of the enclosed region of first UV chamber 4661A such as through a window 4663 (e.g., a quartz window or an assembly such as including a normalization filter, or other filters or coatings). According to various embodiments of the present teachings, the environment within UV curing chamber 4661A can be inert and can be isolated from a housing containing the first set of radiation sources 4662A. According to various systems and methods, in the second enclosed region of UV chamber 4661B, for example, the second substrate 2050B can be held for a specified duration, such as for leveling or to await availability of other processes. During the specified holding duration, a second set of radiation sources 4662B can be disabled.

Regarding support of substrates, such as 2050A and 2050B of FIG. 5, the present inventors have recognized, among other things, that for some operations or material systems, such as in relation to leveling a deposited organic layer, visible defects can be induced in the display regions of a substrate when the substrate is supported in a non-uniform manner. For example, pins, support frames, retracted lift-pins, or vacuum apertures in contact with a substrate can induce visible defects in a finished device.

Without being bound by theory, it is believed that such defects primarily result from localized variations in thermal conductivity that can create local gradients in the temperature of a substrate during, for example, a leveling operation. In an example, a specified temperature uniformity can be maintained in a local region of the substrate, for example, such that deviation in temperature adjacent to or within the local region is limited. For example, a significant temperature variation across the substrate can be tolerated but such variation can have a limited gradient such that the temperature does not vary significantly over a small distance along the substrate. In this manner, abrupt changes in visible characteristics of the finished display can be avoided and such gradual changes are less likely to be noticed or even detectable.

In one approach, regions outside the emitting or display region of the substrate can be used to support a substrate outside of active device areas of a substrate. However, because large portions of a substrate can include emitting regions or portions of the actual display region, it can be impractical to support the substrate only at the periphery of such regions because such support induces unacceptable mechanical forces or stresses elsewhere across a substrate, which may either distort or fracture a substrate. Additionally, the present inventors have also recognized that a correlation can exist between particle generation and a number of instances or locations of contact between other apparatuses and a substrate.

Accordingly, the present inventors have recognized that a substrate, such as substrates 2050A and 2050B of FIG. 5 can be supported by a chuck, for example chuck 4664 of first UV chamber 4661A, such as during an ultraviolet treatment operation, such as at least in part using a pressurized gas "P" to provide a gas cushion. According to various examples, the substrate 4000A can be supported exclusively by a controlled arrangement of the pressurized gas, "P such as to float the substrate 2050A. In another example, substrate 2050A can be mechanically supported in part, such as at a periphery, by one or more pins (e.g., a pin 4666) or a support frame, and a weight of substrate 2050A can be supported in a central region of substrate 2050A by the pressurized gas, "P." In another approach, substrate 2050A can be supported by a pressurized gas "P" impinging on a first surface of substrate 2050A, and an opposing force can be provided such as by a mechanical stop 4668 contacting an opposing face of substrate 2050A. Though first UV chamber 4661A is used for the purpose of illustration, it is to be understood that these teachings apply to all UV chambers shown in FIG. 5. Though pressure is shown for the teachings of FIG. 5, as will be discussed in more detail in reference to the floatation table of FIG. 6, a chuck using pressure and vacuum can also be utilized. In such an example where the substrate 2050A is supported exclusively by the gas cushion, a combination of positive gas pressure and vacuum can be applied through the arrangement of ports. Such a zone having both pressure and vacuum control can effectively provide a fluidic spring between floatation chuck 4664 and substrate 2050A.

Transfer module 4610 of FIG. 5 can be a transfer module as described for second transfer module 4610 of FIG. 4. Regarding the floatation of a substrate, elevating handler 4612, which can be housed in transfer module 4610, can also utilized substrate floatation during a transfer process. Elevating handler 4612 can include a table 4614 (or a corresponding end effector) including pressurized gas "P" to support a substrate at least in part using the pressurized gas. A conveyor, or other apparatus can be used to transport a substrate from, for example, a printing module, such as printing module 4550 of FIG. 4 through gate 4616. Such conveyance means can also include such a pressurized gas arrangement, such that a substrate can be conveyed along a path as indicated by the horizontal arrow shown directing substrate 2050N to UV curing chamber 4661N.

In the illustrative example of FIG. 5, an enclosed transfer module 4610 can house the elevating handler 4612 and table 4614. An inert environment having specified gas purity and specified particulate levels can be established within the enclosed transfer module 4610 as discussed extensively in relation to other examples herein. For example, one or more fan filter units (FFUs) such as a fan filter unit 5202 can be coupled to transfer module 4610. Duct 5201 can provide a return flow of inert gas to be recirculated using FFU 5202. A gas purification system 3130 can be coupled to the enclosed transfer module 4610. While a vertical flow orientation is illustrated in FIG. 5, other configurations can be used, such as a lateral flow configuration. Each of the regions 4661A through 4661N can either share one or more gas purification loops or can each be served by a respective gas purification loop. Similarly, one or more FFUs can be located to provide a laminar airflow parallel to a surface of substrate in each of the regions 4661A through 4661N. A temperature within the enclosed transfer module 4610 or within other portions of the system can be controlled as described extensively in other examples herein, such as using a temperature controller 3140. As will be described in more detail in the teachings regarding FIG. 8 herein, the temperature controller 3140 can be coupled, for example through a heat exchanger, to the FFU 5202 or one or more FFUs elsewhere.

The regions 4661A through 4661N can each include a valve or gate, such as to isolate the inert environment of each enclose region 4661A through 4661N from the transfer module 4610 or from each other. Accordingly, such as during maintenance, a particular region can have its inert environment isolated from the rest of the enclosed regions using a valve or gate.

Figure 6:
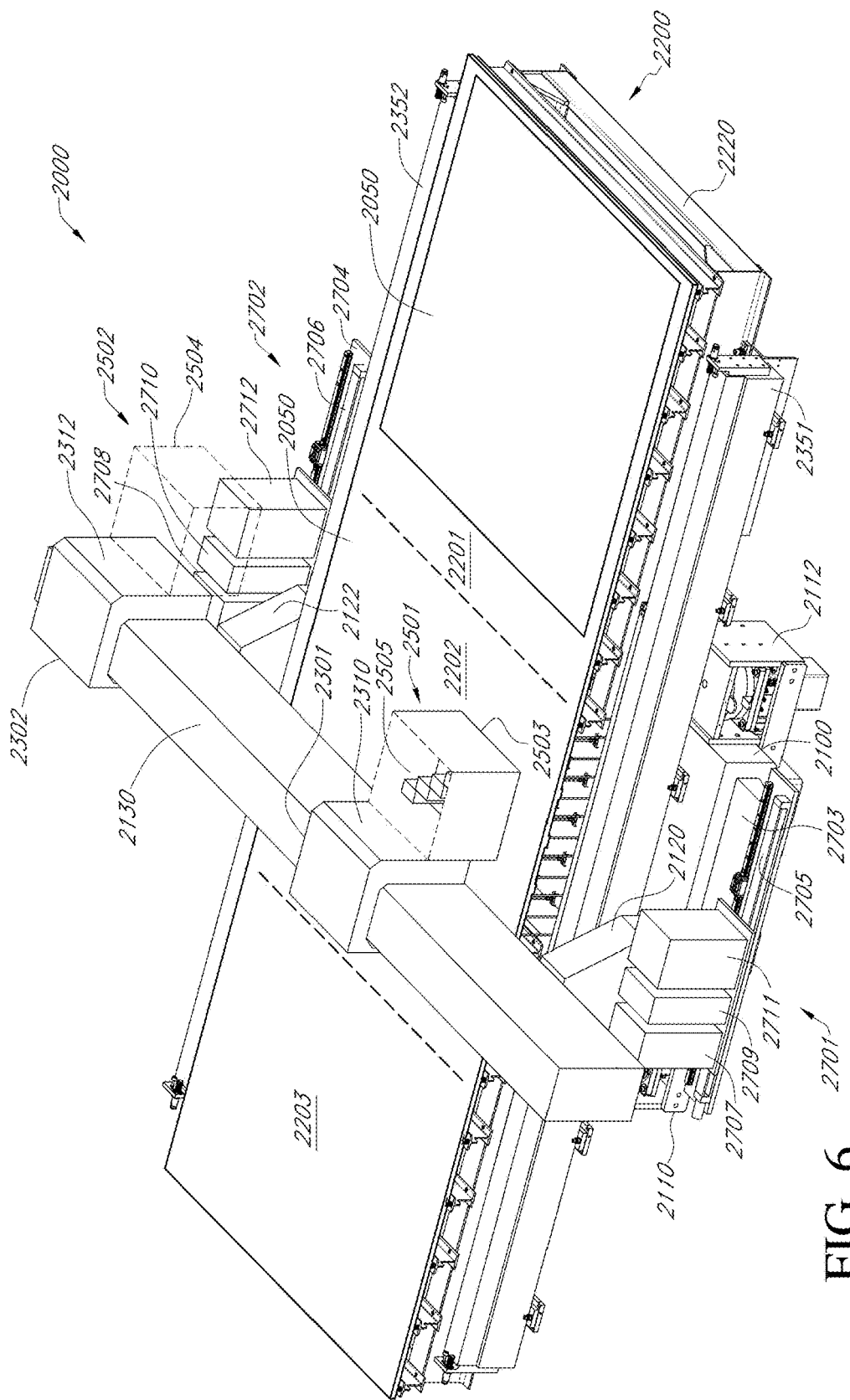
FIG. 6 depicts an expanded iso perspective view of a printing system in accordance with various embodiments of the present teachings.

An OLED inkjet printing system, such as OLED printing system 2000 of FIG. 6, can be housed in include gas enclosure 4510 of printing module 4500 of FIG. 4. Various embodiments of a printing system of FIG. 6, can be comprised of several devices and apparatuses, which allow the reliable placement of ink drops onto specific locations on a substrate. Printing requires relative motion between the printhead assembly and the substrate. This can be accomplished with a motion system, typically a gantry or split axis XYZ system. Either the printhead assembly can move over a stationary substrate (gantry style), or both the printhead and substrate can move, in the case of a split axis configuration. In another embodiment, a printhead assembly can be substantially stationary; for example, in the X and Y axes, and the substrate can move in the X and Y axes relative to the printheads, with Z axis motion provided either by a substrate support apparatus or by a Z-axis motion system associated with a printhead assembly. As the printheads move relative to the substrate, droplets of ink are ejected at the correct time to be deposited in the desired location on a substrate. A substrate can be inserted and removed from the printer using a substrate loading and unloading system. Depending on the printer configuration, this can be accomplished with a mechanical conveyor, a substrate floatation table with a conveyance assembly, or a substrate transfer robot with end effector. For various embodiments of systems and methods of the present teachings, an Y-axis motion system can be based on an air-bearing gripper system.

An OLED inkjet printing system, such as OLED printing system 2000 of FIG. 6, can be comprised of several devices and apparatuses, which allow the reliable placement of ink drops onto specific locations on a substrate. These devices and apparatuses can include, but are not limited to, a printhead assembly, ink delivery system, a motion system for providing relative motion between a printhead assembly and a substrate, substrate support apparatus, substrate loading and unloading system, and printhead management system.

A printhead assembly can include at least one inkjet head, with at least one orifice capable of ejecting droplets of ink at a controlled rate, velocity, and size. The inkjet head is fed by an ink supply system which provides ink to the inkjet head. As shown in an expanded view of FIG. 6, OLED inkjet printing system 2000 can have a substrate, such as substrate 2050, which can be supported by a substrate support apparatus, such as a chuck, for example, but not limited by, a vacuum chuck, a substrate floatation chuck having pressure ports, and a substrate floatation chuck having vacuum and pressure ports. In various embodiments of systems and methods of the present teachings, a substrate support apparatus can be a substrate floatation table. As will be discussed in more detail subsequently herein, substrate floatation table 2200 of FIG. 6 can be used for supporting substrate 2050, and in conjunction with a Y-axis motion system, can be part of a substrate conveyance system providing for the frictionless conveyance of substrate 2050. A Y-axis motion system of the present teachings can include first Y-axis track 2351 and second Y-axis track 2352, which can include a gripper system (not shown) for holding a substrate. Y-axis motion can be provided by either a linear air bearing or linear mechanical system. Substrate floatation table 2200 of OLED inkjet printing system 2000 shown in FIG. 6 can define the travel of substrate 2050 through gas enclosure assembly 1000 of FIG. 1A during a printing process.

FIG. 6 illustrates generally an example of substrate floatation table 2200 for a printing system 2000 that can include a floating conveyance of a substrate, which can have a porous medium to provide floatation. In the example of FIG. 6, a handler or other conveyance can be used to position a substrate 2050 in first region 2201 of a substrate floatation table 2200, such as located on a conveyor. The conveyer can position the substrate 2050 at a specified location within the printing system such as using either mechanical contact (e.g., using an array of pins, a tray, or a support frame configuration), or using gas cushion to controllably float the substrate 2050 (e.g., an "air bearing" table configuration). A printing region 2202 of the substrate floatation table 2200 can be used to controllably deposit one or more layers on the substrate 2050 during fabrication. The printing region 2202 can also be coupled to an second region 2203 of the substrate floatation table 2200. The conveyer can extend along the first region 2201, the printing region 2202, and the second region 2203 of the substrate floatation table 2200, and the substrate 2050 can be repositioned as desired for various deposition tasks, or during a single deposition operation. The controlled environments nearby the first region 2201, the printing region 2202, and the second region 2203 can be commonly-shared. According to various embodiments of printing system 2000 of FIG. 6, first region 2201 can be an input region, and second region 2203 can be an output region. For various embodiments of printing system 2000 of FIG. 6, first region 2201 can be both an input and an output region. Further, function referred to in association with regions 2201, 2202, and 2203, such as input, printing, and output for illustration only. Such regions can be used for other processing steps, such as conveyance of a substrate, or support of a substrate such as during one or more of holding, drying, or thermal treatment of the substrate in one or more other modules.

The printing system 2000 of FIG. 6 can include one or more printhead devices 2505, each printhead device having one or more printheads; e.g. nozzle printing, thermal jet or ink-jet type. The one or more printhead devices 2505 can be coupled to or otherwise traversing an overhead carriage, such as first X-axis carriage assembly 2301. For various embodiments of printing system 2000 of the present teachings, one or more printheads of one or more printhead devices 2505 can be configured to deposit one or more patterned organic layers on the substrate 2050 in a "face up" configuration of the substrate 2050. Such layers can include one or more of an electron injection or transport layer, a hole injection or transport layer, a blocking layer, or an emission layer, for example. Such materials can provide one or more electrically functional layers.

According to the floatation schemes shown in FIG. 6, in an example where the substrate 2050 is supported exclusively by the gas cushion, a combination of positive gas pressure and vacuum can be applied through the arrangement of ports or using a distributed porous medium. Such a zone having both pressure and vacuum control can effectively provide a fluidic spring between the conveyor and a substrate. A combination of positive pressure and vacuum control can provide a fluidic spring with bidirectional stiffness. The gap that exists between the substrate (e.g., substrate 2050) and a surface can be referred to as the "fly height," and such a height can be controlled or otherwise established by controlling the positive pressure and vacuum port states. In this manner, the substrate Z-axis height can be carefully controlled in, for example, the printing region 2202. In some embodiments, mechanical retaining techniques, such as pins or a frame, can be used to restrict lateral translation of the substrate while the substrate is supported by the gas cushion. Such retaining techniques can include using spring loaded structures, such as to reduce the instantaneous forces incident the sides of the substrate while the substrate is being retained; this can be beneficial as a high force impact between a laterally translating substrate and a retaining means can cause substrate chipping or even catastrophic breakage.

Elsewhere, as illustrated generally in FIG. 6, such as where the fly height need not be controlled precisely, pressure-only floatation zones can be provided, such as along the conveyor in the first or second regions 2201 or 2203, or elsewhere. A "transition" floatation zone can be provided such as where a ratio of pressure to vacuum nozzles increases or decreases gradually. In an illustrative example, there can be an essentially uniform height between a pressure-vacuum zone, a transition zone, and a pressure only zone, so that within tolerances, the three zones can lie essentially in one plane. A fly height of a substrate over pressure-only zones elsewhere can be greater than the fly height of a substrate over a pressure-vacuum zone, such as in order to allow enough height so that a substrate will not collide with a floatation table in the pressure-only zones. In an illustrative example, an OLED panel substrate can have a fly height of between about 150 micrometers ($\mu$) to about 300$\mu$ above pressure-only zones, and then between about 30$\mu$ to about 50$\mu$ above a pressure-vacuum zone. In an illustrative example, one or more portions of the substrate floatation table 2200 or other fabrication apparatus can include an "air bearing" assembly provided by NewWay® Air Bearings (Aston, Pa., United States of America).

A porous medium can be used to establish a distributed pressurized gas cushion for floating conveyance or support of the substrate 2050 during one or more of printing, buffering, drying, or thermal treatment. For example, a porous medium "plate" such as coupled to or included as a portion of a conveyor can provide a "distributed" pressure to support the substrate 2050 in a manner similar to the use of individual gas ports. The use of a distributed pressurized gas cushion without using large gas port apertures can in some instances further improve uniformity and reduce or minimize the formation of mura or other visible defects, such as in those instances where the use of relatively large gas ports to create a gas cushion leads to non-uniformity, in spite of the use of a gas cushion.

A porous medium can be obtained such as from Nano TEM Co., Ltd. (Niigata, Japan), such as having physical dimensions specified to occupy an entirety of the substrate 2050, or specified regions of the substrate such as display regions or regions outside display regions. Such a porous medium can include a pore size specified to provide a desired pressurized gas flow over a specified area, while reducing or eliminating mura or other visible defect formation.

Printing requires relative motion between the printhead assembly and the substrate. This can be accomplished with a motion system, typically a gantry or split axis XYZ system. Either the printhead assembly can move over a stationary substrate (gantry style), or both the printhead and substrate can move, in the case of a split axis configuration. In another embodiment, a printhead assembly can be substantially stationary; for example, in the X and Y axes, and the substrate can move in the X and Y axes relative to the printheads, with Z axis motion provided either by a substrate support apparatus or by a Z-axis motion system associated with a printhead assembly. As the printheads move relative to the substrate, droplets of ink are ejected at the correct time to be deposited in the desired location on a substrate. A substrate can be inserted and removed from the printer using a substrate loading and unloading system. Depending on the printer configuration, this can be accomplished with a mechanical conveyor, a substrate floatation table with a conveyance assembly, or a substrate transfer robot with end effector.

With respect to FIG. 6, printing system base 2100, can include first riser 2120 and second riser 2122, upon which bridge 2130 is mounted. For various embodiments of OLED printing system 2000, bridge 2130 can support first X-axis carriage assembly 2301 and second X-axis carriage assembly 2302, which can control the movement of first printhead assembly 2501 and second printhead assembly 2502, respectively across bridge 2130. For various embodiments of printing system 2000, first X-axis carriage assembly 2301 and second X-axis carriage assembly 2302 can utilize a linear air bearing motion system, which are intrinsically low-particle generating. According to various embodiments of a printing system of the present teachings, an X-axis carriage can have a Z-axis moving plate mounted thereupon. In FIG. 6, first X-axis carriage assembly 2301 is depicted with first Z-axis moving plate 2310, while second X-axis carriage assembly 2302 is depicted with second Z-axis moving plate 2312. Though FIG. 6 depicts two carriage assemblies and two printhead assemblies, for various embodiments of OLED inkjet printing system 2000, there can be a single carriage assembly and a single printhead assembly. For example, either of first printhead assembly 2501 and second printhead assembly 2502 can be mounted on an X,Z-axis carriage assembly, while a camera system for inspecting features of substrate 2050 can be mounted on a second X,Z-axis carriage assembly.

In FIG. 6, each printhead assembly, such as first printhead assembly 2501 and second printhead assembly 2502 of FIG. 6, can have a plurality of printheads mounted in at least one printhead device, as depicted in partial view for first printhead assembly 2501, which depicts a plurality of printhead devices 2505. A printhead device can include, for example, but not limited by, fluidic and electronic connections to at least one printhead; each printhead having a plurality of nozzles or orifices capable of ejecting ink at a controlled rate, velocity and size. For various embodiments of printing system 2000, a printhead assembly can include between about 1 to about 60 printhead devices, where each printhead device can have between about 1 to about 30 printheads in each printhead device. A printhead, for example, an industrial inkjet head, can have between about 16 to about 2048 nozzles, which can expel a droplet volume of between about 0.1 pL to about 200 pL.

According to various embodiments of a gas enclosure system of the present teachings, given the sheer number of printhead devices and printheads, first printhead management system 2701 and second printhead management system 2702 can be housed in an auxiliary enclosure, which can be isolated from a printing system enclosure during a printing process for performing various measurement and maintenance tasks with little or no interruption to the printing process. As can be seen in FIG. 6, first printhead assembly 2501 can be seen positioned relative to first printhead management system 2701 for ready performance of various measurement and maintenance procedures that can be performed by first printhead management system apparatuses 2707, 2709 and 2711. Apparatuses 2707, 2709, and 2011 can be any of a variety of subsystems or modules for performing various printhead management functions. For example apparatuses 2707, 2709, and 2011 can be any of a drop measurement module, a printhead replacement module, a purge basin module, and a blotter module.

For OLED printing system 2000 of FIG. 6, various embodiments of a printing system can include substrate floatation table 2200, supported by substrate floatation table base 2220. Substrate floatation table base 2220 can be mounted on printing system base 2100. Substrate floatation table 2200 of OLED printing system can support substrate 2050, as well as defining the travel over which substrate 2050 can be moved through gas enclosure assembly 1000 during the printing of an OLED substrate. A Y-axis motion system of the present teachings can include first Y-axis track 2351 and second Y-axis track 2352, which can include a gripper system (not shown) for holding a substrate. Y-axis motion can be provided by either a linear air bearing or linear mechanical system. In that regard, in conjunction with a motion system; as depicted in FIG. 6, a Y-axis motion system, substrate floatation table 2200 can provide frictionless conveyance of substrate 2050 through a printing system.

Figure 7:
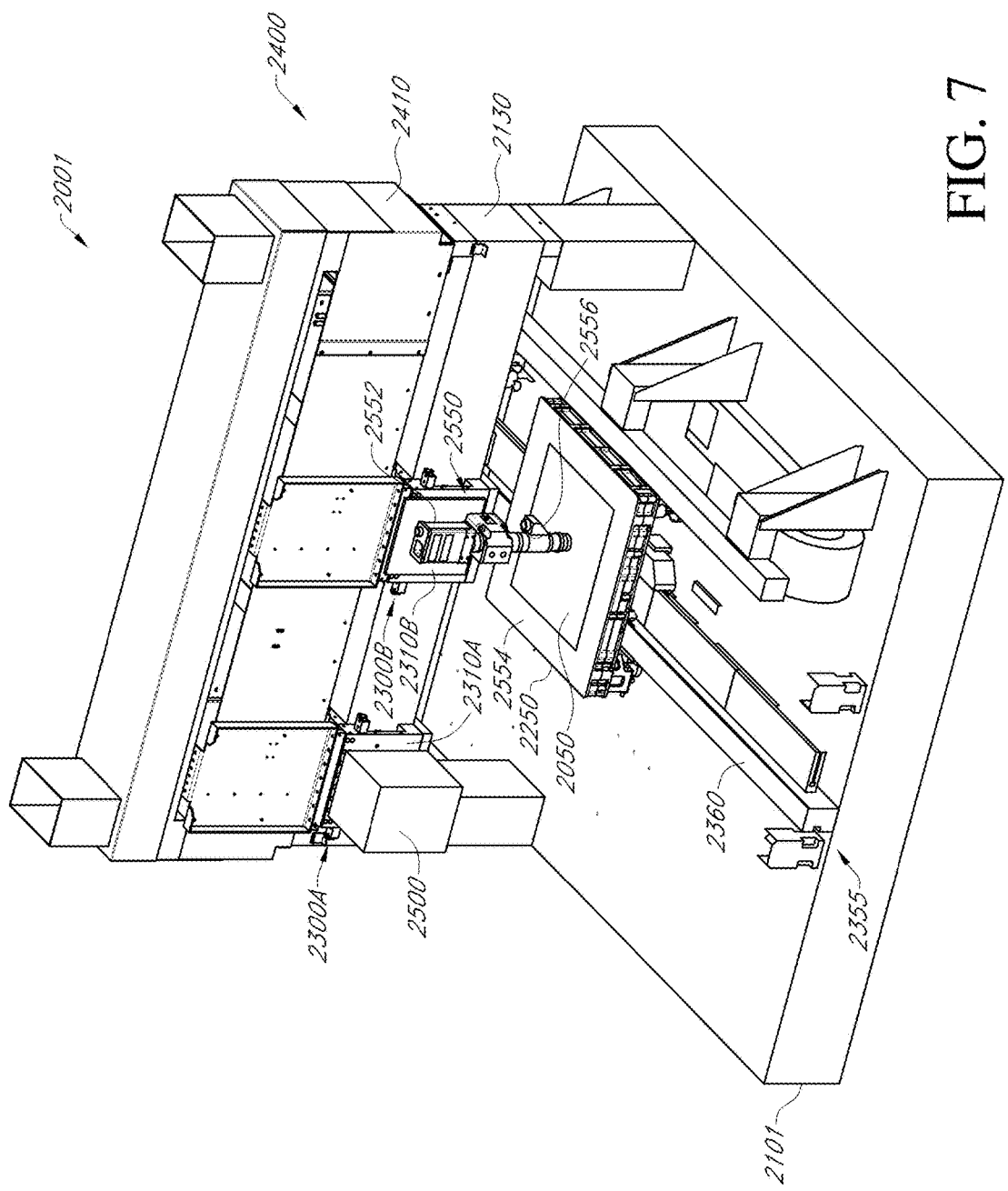
FIG. 7 is an iso perspective view of a printing system in accordance with various embodiments of the present teachings.

In reference to FIG. 7, printing system 2001 can have all of the elements previously described for printing system 2000 of FIG. 6. For example, but not limited by, printing system 2001 of FIG. 7 can have service bundle housing exhaust system 2400 for containing and exhausting particles generated from a service bundle. Service bundle housing exhaust system 2400 of printing system 2001 can include service bundle housing 2410, which can house a service bundle. According to the present teachings, a service bundle can be operatively connected to a printing system to provide various optical, electrical, mechanical and fluidic connections required to operate various devices and apparatuses in a gas enclosure system, for example, but not limited by, various devices and apparatuses associated with a printing system. Printing system 2001 of FIG. 7 can have substrate support apparatus 2250 for supporting substrate 2050, which can be positioned with precision in the Y-axis direction using Y-axis positioning system 2355. Both substrate support apparatus 2250 and Y-axis positioning system 2355 are supported by printing system base 2101. Substrate support apparatus 2250 can be mounted on Y-axis motion assembly 2355 and can be moved on rail system 2360 using, for example, but not limited by, a linear bearing system; either utilizing mechanical bearings or air bearings. For various embodiments of gas enclosure systems, an air bearing motion system helps facilitation frictionless conveyance in the Y-axis direction for a substrate placed on substrate support apparatus 2250. Y-axis motion system 2355 can also optionally use dual rail motion, once again, provided by a linear air bearing motion system or a linear mechanical bearing motion system.

Regarding motion systems supporting various carriage assemblies of the present teachings, such as printing system 2000 of FIG. 6 and printing system 2001 of FIG. 7 can have a first X-axis carriage that can be used for mounting a printhead assembly and a second carriage assembly that can be used to mount a variety of various assemblies, such as a camera assembly. For example, in FIG. 7, orienting system 2001 can have assembly 2300A that is depicted having printhead assembly 2500 mounted thereupon and second X-axis carriage assembly 2300B that is depicted having camera assembly 2550 mounted thereupon. Substrate 2050, which is on substrate support apparatus 2250, can be located in various positions proximal to bridge 2130, for example, during a printing process. Substrate support apparatus 2250 can be mounted on printing system base 2101. In FIG. 7, printing system 2001 can have first X-axis carriage assembly 2300A and second X-axis carriage assembly 2300B mounted on bridge 2130. First X-axis carriage assembly 2300A can also include first Z-axis moving plate 2310A for the Z-axis positioning of printhead assembly 2500, while second X-axis carriage assembly 2300B can have second Z-axis moving plate 2310B for the Z-axis positioning of camera assembly 2550. In that regard, various embodiments of carriage assemblies 2300A and 2300B can provide precision X,Z positioning with respect to a substrate positioned on substrate support 2250 for printhead assembly 2500 and camera assembly 2550, respectively. For various embodiments of printing system 2001, first X-axis carriage assembly 2300A and second X-axis carriage assembly 2300B can utilize a linear air bearing motion system, which is intrinsically low-particle generating.

A camera assembly 2550 can include camera 2552, camera mount assembly 2554 and lens assembly 2556. Camera assembly 2550 can be mounted to motion system 2300B on Z-axis moving plate 2310B, via camera mount assembly 2556. Camera 2552 can be any image sensor device that converts an optical image into an electronic signal, such as by way of non-limiting example, a charge-coupled device (CCD), a complementary metal-oxide-semiconductor (CMOS) device or N-type metal-oxide-semiconductor (NMOS) device. Various image sensor devices can be configured as an array of sensors for an area scan camera, or a single row of sensors, for a line scan camera. Camera assembly 2550 can be connected to image processing system that can include, for example, a computer for storing, processing, and providing results. As previously discussed herein for printing system 2001 of FIG. 7, Z-axis moving plate 2310B can controllably adjust the Z-axis position of camera assembly 2550 relative to substrate 2050. During various processes, such as for example, printing and data collection, substrate 2050 can be controllably positioned relative to the camera assembly 2550 using the X-axis motion system 2300B and Y-axis motion system 2355.

Various camera assemblies can utilize cameras having different capabilities. In various embodiments, camera assembly 2550 of FIG. 7 can be a high-speed, high-resolution camera. In various embodiments of systems and methods of the present teachings, a line scan camera having about 8192 pixels, with a working height of about 190 mm, and capable of scanning at about 34 kHz can be used. In various embodiments of systems and methods of the present teachings, more than one camera can be mounted on an X-axis carriage assembly for various embodiments of a printing system substrate camera assembly, where each camera can have different specifications regarding field of view and resolution. For example, one camera can be a line scan camera for in situ particle inspection, while a second camera can be for regular navigation of a substrate in a gas enclosure system. Such a camera useful for regular navigation can be an area scan camera having a field of view in the range of about 5.4 mm×4 mm with a magnification of about 0.9× to about 10.6 mm×8 mm with a magnification of about 0.45×. In still other embodiments, one camera can be a line scan camera for in situ particle inspection, while a second camera can be for precise navigation of a substrate in a gas enclosure system, for example, for substrate alignment. Such a camera can be useful for precise navigation can be an area scan camera having a field of view of about 0.7 mm×0.5 mm with a magnification of about 7.2×. Various embodiments of a printing system according to the present teachings may have one or more cameras mounted to an X-axis carriage assembly for the purpose of, for example, inspecting various thin film layers that can be printed on an optoelectronic device, as previously described for FIG. 1.

Figure 8:
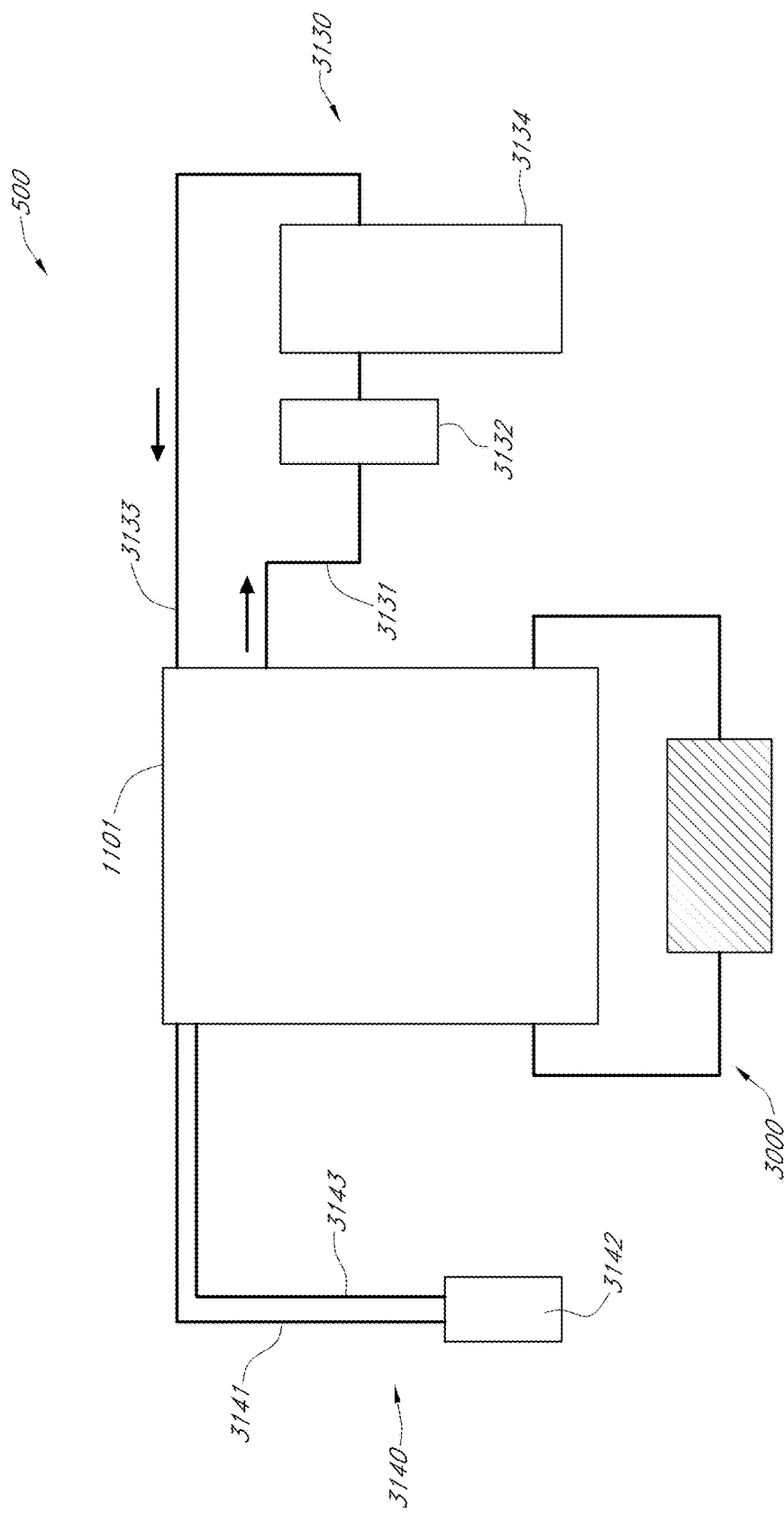
FIG. 8 is a schematic view of various embodiments of gas enclosure assembly and related system components the present teachings.

FIG. 8 is a schematic diagram showing a gas enclosure system 500. Various embodiments of a gas enclosure system 500 according to the present teachings can comprise, for example gas enclosure 4510 of FIG. 4 for various modules and chambers as described for FIG. 5. For illustrative purposes, FIG. 8 will refer to gas enclosure 4510 of FIG. 4 for housing a printing system, though it is to be understood that these teachings apply to a broad number of enclosures, modules and chambers of the present teachings.

Gas purification loop 3130 can be in fluid communication gas enclosure 4510, and at least one thermal regulation system 3140. Additionally, various embodiments of gas enclosure system 500 can have pressurized inert gas recirculation system 3000, which can supply inert gas for operating various devices, such as a substrate floatation table for an OLED printing system. Various embodiments of a pressurized inert gas recirculation system 3000 can utilize a compressor, a blower and combinations of the two as sources for various embodiments of pressurized inert gas recirculation system 3000, as will be discussed in more detail subsequently herein. Additionally, gas enclosure system 500 can have a circulation and filtration system internal to gas enclosure system 500 (not shown).

As depicted in FIG. 8, for various embodiments of a gas enclosure assembly according to the present teachings, the design of a filtration system can separate the inert gas circulated through gas purification loop 3130 from the inert gas that is continuously filtered and circulated internally for various embodiments of a gas enclosure assembly. Gas purification loop 3130 includes outlet line 3131 from gas enclosure 4510 of FIG. 4, to a solvent removal component 3132 and then to gas purification system 3134. Inert gas purified of solvent and other reactive gas species, such as oxygen and water vapor, are then returned to gas enclosure 4510 through inlet line 3133. Gas purification loop 3130 may also include appropriate conduits and connections, and sensors, for example, oxygen, water vapor and solvent vapor sensors. A gas circulating unit, such as a fan, blower or motor and the like, can be separately provided or integrated, for example, in gas purification system 3134, to circulate gas through gas purification loop 3130. According to various embodiments of a gas enclosure assembly, though solvent removal system 3132 and gas purification system 3134 are shown as separate units in the schematic shown in FIG. 8, solvent removal system 3132 and gas purification system 3134 can be housed together as a single purification unit.

Gas purification loop 3130 of FIG. 8 can have solvent removal system 3132 placed upstream of gas purification system 3134, so that inert gas circulated from gas enclosure 4510 of FIG. 4 passes through solvent removal system 3132 via outlet line 3131. According to various embodiments, solvent removal system 3132 may be a solvent trapping system based on adsorbing solvent vapor from an inert gas passing through solvent removal system 3132 of FIG. 8. A bed or beds of a sorbent, for example, but not limited by, such as activated charcoal, molecular sieves, and the like, may effectively remove a wide variety of organic solvent vapors. For various embodiments of a gas enclosure system cold trap technology may be employed to remove solvent vapors in solvent removal system 3132. As previously discussed herein, for various embodiments of a gas enclosure system according to the present teachings, sensors, such as oxygen, water vapor and solvent vapor sensors, may be used to monitor the effective removal of such species from inert gas continuously circulating through a gas enclosure system, such as gas enclosure system 500 of FIG. 8. Various embodiments of a solvent removal system can indicate when sorbent, such as activated carbon, molecular sieves, and the like, has reached capacity, so that the bed or beds of sorbent can be regenerated or replaced. Regeneration of a molecular sieve can involve heating the molecular sieve, contacting the molecular sieve with a forming gas, a combination thereof, and the like. Molecular sieves configured to trap various species, including oxygen, water vapor, and solvents, can be regenerated by heating and exposure to a forming gas that comprises hydrogen, for example, a forming gas comprising about 96% nitrogen and 4% hydrogen, with said percentages being by volume or by weight. Physical regeneration of activated charcoal can be done using a similar procedure of heating under an inert environment.

Any suitable gas purification system can be used for gas purification system 3134 of gas purification loop 3130 of FIG. 8. Gas purification systems available, for example, from MBRAUN Inc., of Statham, N.H., or Innovative Technology of Amesbury, Mass., may be useful for integration into various embodiments of a gas enclosure assembly according to the present teachings. Gas purification system 3134 can be used to purify one or more inert gases in gas enclosure system 500, for example, to purify the entire gas atmosphere within a gas enclosure assembly. As previously discussed herein, in order to circulate gas through gas purification loop 3130, gas purification system 3134 can have a gas circulating unit, such as a fan, blower or motor, and the like. In that regard, a gas purification system can be selected depending on the volume of the enclosure, which can define a volumetric flow rate for moving an inert gas through a gas purification system. For various embodiments of gas enclosure system having a gas enclosure assembly with a volume of up to about 4 $m^3$; a gas purification system that can move about 84 $m^3/h$ can be used. For various embodiments of gas enclosure system having a gas enclosure assembly with a volume of up to about 10 $m^3$; a gas purification system that can move about 155 $m^3/h$ can be used. For various embodiments of a gas enclosure assembly having a volume of between about 52-114 $m^3$, more than one gas purification system may be used.

Any suitable gas filters or purifying devices can be included in the gas purification system 3134 of the present teachings. In some embodiments, a gas purification system can comprise two parallel purifying devices, such that one of the devices can be taken off line for maintenance and the other device can be used to continue system operation without interruption. In some embodiments, for example, the gas purification system can comprise one or more molecular sieves. In some embodiments, the gas purification system can comprise at least a first molecular sieve, and a second molecular sieve, such that, when one of the molecular sieves becomes saturated with impurities, or otherwise is deemed not to be operating efficiently enough, the system can switch to the other molecular sieve while regenerating the saturated or non-efficient molecular sieve. A control unit can be provided for determining the operational efficiency of each molecular sieve, for switching between operation of different molecular sieves, for regenerating one or more molecular sieves, or for a combination thereof. As previously discussed herein, molecular sieves may be regenerated and reused.

Thermal regulation system 3140 of FIG. 8 can include at least one chiller 3142, which can have fluid outlet line 3141 for circulating a coolant into a gas enclosure assembly, and fluid inlet line 3143 for returning the coolant to the chiller. An at least one fluid chiller 3142 can be provided for cooling the gas atmosphere within gas enclosure system 500. For various embodiments of a gas enclosure system of the present teachings, fluid chiller 3142 delivers cooled fluid to heat exchangers within the enclosure, where inert gas is passed over a filtration system internal the enclosure. At least one fluid chiller can also be provided with gas enclosure system 500 to cool heat evolving from an apparatus enclosed within gas enclosure system 500. For example, but not limited by, at least one fluid chiller can also be provided for gas enclosure system 500 to cool heat evolving from an OLED printing system. Thermal regulation system 3140 can comprise heat-exchange or Peltier devices and can have various cooling capacities. For example, for various embodiments of a gas enclosure system, a chiller can provide a cooling capacity of from between about 2 kW to about 20 kW. Various embodiments of a gas enclosure system can have a plurality of fluid chillers that can chill one or more fluids. In some embodiments, the fluid chillers can utilize a number of fluids as coolant, for example, but not limited by, water, anti-freeze, a refrigerant, and a combination thereof as a heat exchange fluid. Appropriate leak-free, locking connections can be used in connecting the associated conduits and system components.

The present teachings are intended to be illustrative, and not restrictive. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A process of forming a polymeric thin film layer on a substrate, the method comprising:
   providing an inert processing environment;
   providing an OLED device substrate;
   providing an ink composition, the ink composition comprising:
   40 wt. % to 60 wt. % polyethylene glycol dimethacrylate monomer, polyethylene glycol diacrylate monomer, or a combination thereof, wherein the polyethylene glycol dimethacrylate monomer and the polyethylene glycol diacrylate monomer have number average molecular weights in the range from about 230 g/mole to about 430 g/mole;
   25 wt. % to 50 wt. % monoacrylate monomer, monomethacrylate monomer, or a combination thereof, having a viscosity in the range from about 10 cps to about 27 cps at 22° C.;
   4 wt. % to 10 wt. % multifunctional acrylate crosslinking agent, a multifunctional methacrylate crosslinking agent, or a combination thereof; and
   0.1 wt. % to 10 wt. % crosslinking photoinitiator,
   the ink composition having a surface tension of between about 32 dynes/cm and about 45 dynes/cm at 22° C.;
   printing a layer of the ink composition over a defined area of the substrate, and
   curing the layer of printed ink, wherein an organic polymeric thin film is formed.

2. The process claim 1, further comprising before the step of providing an OLED device substrate:
   providing an industrial printing system housed within the interior of a gas enclosure, wherein the industrial printing system comprises:
   a printhead assembly comprising at least one printhead;
   a substrate support system for supporting a substrate; and
   a motion system for the precise positioning of the substrate relative to the printhead assembly; and
   a UV curing module.

3. The process of claim 1, wherein the inert process environment is provided using an inert gas selected from nitrogen, any of the noble gases, and combinations thereof.

4. The process of claim 1, wherein the inert process environment has water vapor content and oxygen content each at less than 100 ppm.

5. The process of claim 1, wherein the cured layer of printed ink has a thickness of no greater than 6 μm.

6. The process of claim 1, wherein the ink composition further comprises 1 wt. % to 15 wt. % of a spreading modifier having a viscosity in the range from about 10 cps to about 20 cps at 22° C. and a surface tension in the range from about 35 dynes/cm to about 39 dynes/cm at 22° C.

7. The process of claim 6, wherein the spreading modifier comprises an alkoxylated aliphatic diacrylate monomer, an alkoxylated aliphatic dimethacrylate monomer, or a combination thereof.

8. The process of claim 1, wherein the ink composition comprises 45 wt. % to 57 wt. % polyethylene glycol dimethacrylate monomer, polyethylene glycol diacrylate monomer, or combination thereof and 30 wt. % to 40 wt. % monoacrylate monomer, monomethacrylate monomer, or combination thereof and has a viscosity in the range from about 10 cps to about 27 cps at 22° C.

9. The process of claim 1, wherein the crosslinking photoinitiator comprises pentaerythritol tetraacrylate, pentaerythritol tetramethacrylate, di(trimethylolpropane) tetraacrylate, di(trimethylolpropane) tetramethacrylate or a combination thereof.

10. The process of claim 1, wherein the crosslinking photoinitiator comprises 2,4,6-trimethylbenzoyl-diphenyl-phosphine oxide.

11. The process of claim 1, wherein the monoacrylate monomer, monomethacrylate monomer, or combination thereof comprises a cyclic monoacrylate monomer, cyclic monomethacrylate monomer, or a combination thereof.

12. The process of claim 11, wherein the cyclic monoacrylate monomer, cyclic monomethacrylate monomer, or combination thereof comprises dicyclopentenyloxyethyl acrylate, dicyclopentenyloxyethyl methacrylate, or a combination thereof.

13. The process of claim 12, wherein the cyclic monoacrylate monomer, cyclic monomethacrylate monomer, or combination thereof further comprises isobornyl acrylate, isobornyl methacrylate, or a combination thereof.

14. The process of claim 13, wherein less than 10 wt. % of the ink composition is comprised of the isobornyl acrylate, isobornyl methacrylate, or a combination thereof.

15. The process of claim 1, wherein the monoacrylate monomer, monomethacrylate monomer, or combination thereof comprises an aliphatic monoacrylate monomer, aliphatic monomethacrylate monomer, or a combination thereof.

16. The process of claim 15, wherein the aliphatic monoacrylate monomer, aliphatic monomethacrylate monomer or combination thereof comprises n-octadecyl acrylate, n-octadecyl methacrylate, or a combination thereof.

17. The process of claim 16, wherein the ink composition comprises 29 wt. % to 40 wt. % of the n-octadecyl acrylate, n-octadecyl methacrylate, or a combination thereof.

18. The process of claim 1, wherein the defined area of the substrate comprises an electroluminescent region of an OLED.

19. The process of claim 1, wherein the organic polymeric thin film is part of an encapsulation stack on an active region of an OLED device, the encapsulation stack further comprising an inorganic device layer adjacent to the organic polymeric thin film.

20. The process of claim 1, wherein the OLED device substrate is an electrode of an OLED pixel.

* * * * *